United States Patent
Singh

(10) Patent No.: US 11,942,309 B2
(45) Date of Patent: Mar. 26, 2024

(54) BIAS SUPPLY WITH RESONANT SWITCHING

(71) Applicant: Advanced Energy Industries, Inc., Fort Collins, CO (US)

(72) Inventor: Maneesh Kumar Singh, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 261 days.

(21) Appl. No.: 17/584,940

(22) Filed: Jan. 26, 2022

(65) Prior Publication Data

US 2023/0253187 A1 Aug. 10, 2023

(51) Int. Cl.
| | | |
|---|---|---|
| *H01J 37/32* | (2006.01) | |
| *H01J 37/305* | (2006.01) | |
| *H01L 21/3065* | (2006.01) | |
| *H01L 21/67* | (2006.01) | |
| *H05H 1/24* | (2006.01) | |

(52) U.S. Cl.
CPC .... *H01J 37/32284* (2013.01); *H01J 37/3053* (2013.01); *H01L 21/3065* (2013.01); *H01L 21/67069* (2013.01); *H05H 1/24* (2013.01)

(58) Field of Classification Search
CPC .......... H01J 37/32082; H01J 37/32706; H01J 37/32174; H01J 37/32284; H01J 37/32128; H01J 37/3053; H01L 21/3065; H01L 21/67069; H03K 3/57; H05H 1/24
USPC ........................................ 361/240
See application file for complete search history.

(56) References Cited

U.S. PATENT DOCUMENTS

| | | |
|---|---|---|
| 4,622,094 A | 11/1986 | Otsubo |
| 4,693,805 A | 9/1987 | Quazi |
| 4,891,118 A | 1/1990 | Ooiwa et al. |
| 4,963,239 A | 10/1990 | Shimamura et al. |

(Continued)

FOREIGN PATENT DOCUMENTS

| | | |
|---|---|---|
| CN | 1451172 A | 10/2003 |
| CN | 1839459 A | 9/2006 |

(Continued)

OTHER PUBLICATIONS

Non Final Office Action received for U.S. Appl. No. 13/596,976 dated Nov. 6, 2015, 77 pages.

(Continued)

*Primary Examiner* — Kevin J Comber
(74) *Attorney, Agent, or Firm* — Neugeboren O'Dowd PC

(57) ABSTRACT

Bias supplies and plasma processing systems are disclosed. One bias supply comprises an output node, a return node, and a power section coupled to the output node and the return node. A resonant switch section is coupled to the power section at a first node, a second node, and a third node wherein the resonant switch section is configured to connect and disconnect a current pathway between the first node and the second node to apply an asymmetric periodic voltage waveform at the output node relative to the return node. The asymmetric periodic voltage waveform includes a first portion that begins with a first negative voltage and changes to a positive peak voltage, a second portion that changes from the positive peak voltage level to a third voltage level and a fourth portion that includes a negative voltage ramp from the third voltage level to a fourth voltage level.

12 Claims, 12 Drawing Sheets

(56) References Cited

U.S. PATENT DOCUMENTS

| | | |
|---|---|---|
| 5,057,185 A | 10/1991 | Thomas, III et al. |
| 5,156,703 A | 10/1992 | Oechsner |
| 5,160,397 A | 11/1992 | Doki et al. |
| 5,179,264 A | 1/1993 | Cuomo et al. |
| 5,242,561 A | 9/1993 | Sato |
| 5,247,669 A | 9/1993 | Abraham et al. |
| 5,332,880 A | 7/1994 | Kubota et al. |
| 5,410,691 A | 4/1995 | Taylor |
| 5,415,718 A | 5/1995 | Ohmi et al. |
| 5,427,669 A | 6/1995 | Drummond |
| 5,487,785 A | 1/1996 | Horike et al. |
| 5,517,084 A | 5/1996 | Leung |
| 5,535,906 A | 7/1996 | Drummond |
| 5,556,501 A | 9/1996 | Collins et al. |
| 5,767,628 A | 6/1998 | Keller et al. |
| 5,770,972 A | 6/1998 | Freuler et al. |
| 5,859,428 A | 1/1999 | Fruchtman |
| 5,907,221 A | 5/1999 | Sato et al. |
| 5,936,481 A | 8/1999 | Fujii |
| 5,983,828 A | 11/1999 | Savas |
| 6,030,667 A | 2/2000 | Nakagawa et al. |
| 6,051,114 A | 4/2000 | Yao et al. |
| 6,110,287 A | 8/2000 | Arai et al. |
| 6,129,806 A | 10/2000 | Kaji et al. |
| 6,156,667 A | 12/2000 | Jewett |
| 6,162,709 A | 12/2000 | Raoux et al. |
| 6,180,019 B1 | 1/2001 | Kazumi et al. |
| 6,201,208 B1 | 3/2001 | Wendt et al. |
| 6,273,022 B1 | 8/2001 | Pu et al. |
| 6,288,493 B1 | 9/2001 | Lee et al. |
| 6,291,938 B1 | 9/2001 | Jewett et al. |
| 6,313,583 B1 | 11/2001 | Arita et al. |
| 6,326,584 B1 | 12/2001 | Jewett et al. |
| 6,392,210 B1 | 5/2002 | Jewett et al. |
| 6,463,875 B1 | 10/2002 | Chen et al. |
| 6,478,924 B1 | 11/2002 | Shamouilian et al. |
| 6,507,155 B1 | 1/2003 | Barnes et al. |
| 6,544,895 B1 | 4/2003 | Donohoe |
| 6,568,346 B2 | 5/2003 | Pu et al. |
| 6,583,572 B2 | 6/2003 | Veltrop et al. |
| 6,617,794 B2 | 9/2003 | Barnes et al. |
| 6,621,674 B1 | 9/2003 | Zahiringer et al. |
| 6,646,385 B2 | 11/2003 | Howald et al. |
| 6,685,798 B1 | 2/2004 | Howald et al. |
| 6,694,915 B1 | 2/2004 | Howald et al. |
| 6,707,051 B2 | 3/2004 | Shun'ko |
| 6,714,033 B1 | 3/2004 | Makhratchev et al. |
| 6,724,148 B1 | 3/2004 | Makhratchev et al. |
| 6,756,737 B2 | 6/2004 | Doi et al. |
| 6,777,037 B2 | 8/2004 | Sumiya et al. |
| 6,794,301 B2 | 9/2004 | Savas |
| 6,819,096 B2 | 11/2004 | Gonzalez et al. |
| 6,822,396 B2 | 11/2004 | Gonzalez et al. |
| 6,863,018 B2 | 3/2005 | Koizumi et al. |
| 6,872,289 B2 | 3/2005 | Mizuno et al. |
| 6,885,153 B2 | 4/2005 | Quon |
| 6,885,453 B2 | 4/2005 | Kaufmann |
| 6,893,533 B2 | 5/2005 | Holland et al. |
| 6,913,938 B2 | 7/2005 | Shanmugasundram et al. |
| 6,920,312 B1 | 7/2005 | Benjamin |
| 6,924,455 B1 | 8/2005 | Chen et al. |
| 6,927,358 B2 | 8/2005 | Gonzalez et al. |
| 6,946,063 B1 | 9/2005 | Gonzalez et al. |
| 6,984,198 B2 | 1/2006 | Krishnamurthy et al. |
| 7,005,845 B1 | 2/2006 | Gonzalez et al. |
| 7,019,253 B2 | 3/2006 | Johnson et al. |
| 7,046,524 B2 | 5/2006 | Hoffman et al. |
| 7,059,267 B2 | 6/2006 | Hedberg et al. |
| 7,096,819 B2 | 8/2006 | Chen et al. |
| 7,122,965 B2 | 10/2006 | Goodman |
| 7,132,618 B2 | 11/2006 | Hoffman et al. |
| 7,201,936 B2 | 4/2007 | Schwarm et al. |
| 7,245,084 B1 | 7/2007 | Gonzalez et al. |
| 7,253,117 B2 | 8/2007 | Donohoe |
| 7,292,047 B2 | 11/2007 | Tanaka et al. |
| 7,297,637 B2 | 11/2007 | Hedberg et al. |
| 7,373,899 B2 | 5/2008 | Sumiya et al. |
| 7,468,494 B2 | 12/2008 | Gonzalez et al. |
| 7,520,956 B2 | 4/2009 | Samukawa et al. |
| 7,528,386 B2 | 5/2009 | Ruzic et al. |
| 7,645,357 B2 | 1/2010 | Paterson et al. |
| 7,725,208 B2 | 5/2010 | Shanmugasundram et al. |
| 7,737,702 B2 | 6/2010 | Pipitone |
| 7,764,140 B2 | 7/2010 | Nagarkatti et al. |
| 7,777,179 B2 | 8/2010 | Chen et al. |
| 7,783,375 B2 | 8/2010 | Shanmugasundram et al. |
| 7,811,939 B2 | 10/2010 | Kushibiki et al. |
| 7,847,247 B2 | 12/2010 | Denpoh |
| 7,928,664 B2 | 4/2011 | Beland |
| 8,012,306 B2 | 9/2011 | Dhindsa |
| 8,040,068 B2 | 10/2011 | Coumou et al. |
| 8,103,492 B2 | 1/2012 | Brcka |
| 8,140,292 B2 | 3/2012 | Wendt |
| 8,169,595 B2 | 5/2012 | Schriever et al. |
| 8,264,154 B2 | 9/2012 | Banner et al. |
| 8,319,436 B2 | 11/2012 | Carter et al. |
| 8,329,054 B2 | 12/2012 | Ichino et al. |
| 8,334,657 B2 | 12/2012 | Xia |
| 8,357,264 B2 | 1/2013 | Shannon et al. |
| 8,404,598 B2 | 3/2013 | Liao et al. |
| 8,409,398 B2 | 4/2013 | Brcka |
| 8,475,673 B2 | 7/2013 | Edelberg |
| 8,575,843 B2 | 11/2013 | Moore et al. |
| 8,641,916 B2 | 2/2014 | Yatsuda et al. |
| 8,674,606 B2 | 3/2014 | Carter et al. |
| 8,698,107 B2 | 4/2014 | Godet et al. |
| 8,742,669 B2 | 6/2014 | Carter et al. |
| 8,801,950 B2 | 8/2014 | Lee |
| 8,900,402 B2 | 12/2014 | Holland et al. |
| 9,088,267 B2 | 7/2015 | Blackburn et al. |
| 9,105,447 B2 | 8/2015 | Brouk et al. |
| 9,114,666 B2 | 8/2015 | Valcore, Jr. et al. |
| 9,123,509 B2 | 9/2015 | Papasouliotis et al. |
| 9,177,756 B2 | 11/2015 | Holland et al. |
| 9,208,992 B2 | 12/2015 | Brouk et al. |
| 9,210,790 B2 | 12/2015 | Hoffman et al. |
| 9,283,635 B2 | 3/2016 | Peters |
| 9,287,086 B2 | 3/2016 | Brouk et al. |
| 9,287,092 B2 | 3/2016 | Brouk et al. |
| 9,305,803 B2 | 4/2016 | Morimoto et al. |
| 9,309,594 B2 | 4/2016 | Hoffman et al. |
| 9,362,089 B2 | 6/2016 | Brouk et al. |
| 9,378,931 B2 | 6/2016 | Kwon et al. |
| 9,390,893 B2 | 7/2016 | Valcore, Jr. et al. |
| 9,425,029 B2 | 8/2016 | Muto et al. |
| 9,435,029 B2 | 9/2016 | Brouk et al. |
| 9,478,397 B2 | 10/2016 | Blackburn et al. |
| 9,536,749 B2 | 1/2017 | Marakhtanov et al. |
| 9,593,421 B2 | 3/2017 | Baek et al. |
| 9,595,424 B2 | 3/2017 | Marakhtanov et al. |
| 9,604,877 B2 | 3/2017 | Veerasamy et al. |
| 9,685,297 B2 | 6/2017 | Carter et al. |
| 9,754,767 B2 | 9/2017 | Kawasaki |
| 9,754,768 B2 | 9/2017 | Yamada et al. |
| 9,761,414 B2 | 9/2017 | Marakhtanov et al. |
| 9,761,419 B2 | 9/2017 | Nagami |
| 9,767,988 B2 | 9/2017 | Brouk et al. |
| 9,788,405 B2 | 10/2017 | Kawasaki et al. |
| 9,818,584 B2 | 11/2017 | Miller et al. |
| 9,872,373 B1 | 1/2018 | Shimizu et al. |
| 9,892,888 B2 | 2/2018 | Baek et al. |
| 10,607,813 B2 | 3/2020 | Fairbairn et al. |
| 10,707,055 B2 | 7/2020 | Shaw et al. |
| 10,791,617 B2 | 9/2020 | Dorf et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,896,807 B2 | 1/2021 | Fairbairn et al. |
| 11,011,349 B2 | 5/2021 | Brouk et al. |
| 11,189,454 B2 | 11/2021 | Carter et al. |
| 11,264,209 B2 | 3/2022 | Van Zyl et al. |
| 11,282,677 B2 | 3/2022 | Shaw et al. |
| 11,437,221 B2 | 9/2022 | Carter et al. |
| 2001/0014540 A1 | 8/2001 | Shan et al. |

(56) References Cited

U.S. PATENT DOCUMENTS

| | | |
|---|---|---|
| 2002/0038631 A1 | 4/2002 | Sumiya et al. |
| 2002/0115301 A1 | 8/2002 | Savas |
| 2002/0144786 A1 | 10/2002 | Chiang et al. |
| 2002/0185228 A1 | 12/2002 | Chen et al. |
| 2003/0033116 A1 | 2/2003 | Brcka et al. |
| 2004/0007326 A1 | 1/2004 | Roche et al. |
| 2004/0094402 A1 | 5/2004 | Gopalraja et al. |
| 2004/0149218 A1 | 8/2004 | Collins et al. |
| 2004/0226657 A1 | 11/2004 | Hoffman |
| 2005/0090118 A1 | 4/2005 | Shannon et al. |
| 2005/0160985 A1 | 7/2005 | Brcka |
| 2005/0260354 A1 | 11/2005 | Singh et al. |
| 2006/0088655 A1 | 4/2006 | Collins et al. |
| 2006/0130971 A1 | 6/2006 | Chang et al. |
| 2006/0171093 A1 | 8/2006 | Ishimura et al. |
| 2006/0226786 A1 | 10/2006 | Lin et al. |
| 2007/0121267 A1 | 5/2007 | Kotani et al. |
| 2007/0139122 A1 | 6/2007 | Nagarkatti et al. |
| 2007/0186855 A1 | 8/2007 | Dhindsa |
| 2007/0186856 A1 | 8/2007 | Yasui et al. |
| 2007/0193975 A1 | 8/2007 | Wilson |
| 2007/0246163 A1 | 10/2007 | Paterson et al. |
| 2008/0135400 A1 | 6/2008 | Kadlec et al. |
| 2009/0077150 A1 | 3/2009 | Wendt |
| 2009/0078678 A1 | 3/2009 | Kojima et al. |
| 2009/0200494 A1 | 8/2009 | Hatem et al. |
| 2009/0255800 A1 | 10/2009 | Koshimizu |
| 2009/0298287 A1 | 12/2009 | Shannon et al. |
| 2010/0063787 A1 | 3/2010 | Brcka |
| 2010/0072172 A1 | 3/2010 | Ui et al. |
| 2010/0126893 A1 | 5/2010 | Sinykin |
| 2010/0154994 A1 | 6/2010 | Fischer et al. |
| 2010/0208409 A1 | 8/2010 | Bluck et al. |
| 2010/0276273 A1 | 11/2010 | Heckman et al. |
| 2010/0296977 A1 | 11/2010 | Hancock |
| 2010/0332011 A1 | 12/2010 | Venugopal et al. |
| 2011/0031217 A1 | 2/2011 | Himori |
| 2011/0038187 A1 | 2/2011 | Horishita et al. |
| 2011/0065161 A1 | 3/2011 | Kwasinski et al. |
| 2011/0089023 A1 | 4/2011 | Tanaka et al. |
| 2011/0095689 A1 | 4/2011 | Gilbert |
| 2011/0220491 A1 | 9/2011 | Hilliard |
| 2011/0223750 A1 | 9/2011 | Hayash et al. |
| 2011/0226617 A1 | 9/2011 | Hofmann et al. |
| 2011/0248634 A1 | 10/2011 | Heil et al. |
| 2011/0253672 A1 | 10/2011 | Kamibayashi et al. |
| 2011/0259851 A1* | 10/2011 | Brouk .................... C23C 16/50 216/61 |
| 2012/0052599 A1 | 3/2012 | Brouk et al. |
| 2012/0052689 A1 | 3/2012 | Tokashiki |
| 2012/0187844 A1 | 7/2012 | Hoffman et al. |
| 2012/0217221 A1 | 8/2012 | Hoffman et al. |
| 2012/0318456 A1 | 12/2012 | Brouk et al. |
| 2012/0319584 A1 | 12/2012 | Brouk et al. |
| 2013/0001196 A1 | 1/2013 | Hoffman et al. |
| 2013/0006555 A1 | 1/2013 | Roberg et al. |
| 2013/0122711 A1 | 5/2013 | Marakhtanov et al. |
| 2013/0136872 A1 | 5/2013 | Booth et al. |
| 2013/0320853 A1 | 12/2013 | Carter et al. |
| 2014/0061156 A1 | 3/2014 | Brouk et al. |
| 2014/0062303 A1 | 3/2014 | Hoffman et al. |
| 2014/0062495 A1 | 3/2014 | Carter et al. |
| 2014/0117861 A1 | 5/2014 | Finley et al. |
| 2014/0148016 A1 | 5/2014 | Kanazawa et al. |
| 2014/0173158 A1 | 6/2014 | Valcore, Jr. |
| 2014/0265910 A1 | 9/2014 | Kobayashi et al. |
| 2014/0302682 A1 | 10/2014 | Muto et al. |
| 2014/0305905 A1 | 10/2014 | Yamada et al. |
| 2015/0076112 A1 | 3/2015 | Sriraman et al. |
| 2015/0126037 A1 | 5/2015 | Chen et al. |
| 2015/0144596 A1 | 5/2015 | Brouk et al. |
| 2015/0315698 A1 | 11/2015 | Chistyakov |
| 2015/0325413 A1 | 11/2015 | Km et al. |
| 2015/0371827 A1 | 12/2015 | Godet et al. |
| 2016/0020072 A1 | 1/2016 | Brouk et al. |
| 2016/0020108 A1 | 1/2016 | Ranjan et al. |
| 2016/0027616 A1 | 1/2016 | Ramaswamy et al. |
| 2016/0053017 A1 | 2/2016 | Orentas et al. |
| 2016/0056017 A1 | 2/2016 | Kim et al. |
| 2016/0064247 A1 | 3/2016 | Tomura et al. |
| 2016/0079037 A1 | 3/2016 | Hirano et al. |
| 2016/0126068 A1 | 5/2016 | Lee et al. |
| 2016/0126069 A1 | 5/2016 | Kwon et al. |
| 2016/0240353 A1 | 8/2016 | Nagami |
| 2016/0351375 A1 | 12/2016 | Valcore, Jr. et al. |
| 2017/0018411 A1 | 1/2017 | Sriraman et al. |
| 2017/0029941 A1 | 2/2017 | Allen et al. |
| 2017/0053820 A1 | 2/2017 | Bosch et al. |
| 2017/0099723 A1 | 4/2017 | Nagami et al. |
| 2017/0154781 A1 | 6/2017 | Ranjan et al. |
| 2017/0278665 A1 | 9/2017 | Carter et al. |
| 2018/0019100 A1 | 1/2018 | Brouk et al. |
| 2018/0047573 A1 | 2/2018 | Tanaka et al. |
| 2018/0082824 A1 | 3/2018 | Likhanskii et al. |
| 2018/0226225 A1 | 8/2018 | Koh et al. |
| 2018/0342903 A1 | 11/2018 | Luu et al. |
| 2019/0066979 A1 | 2/2019 | Shoeb et al. |
| 2019/0157040 A1 | 5/2019 | Fairbairn et al. |
| 2019/0157041 A1 | 5/2019 | Zyl et al. |
| 2019/0157042 A1 | 5/2019 | Van Zyl et al. |
| 2019/0157043 A1* | 5/2019 | Shaw ................ H01J 37/32477 |
| 2019/0172685 A1* | 6/2019 | Van Zyl ............ H01J 37/32183 |
| 2019/0180982 A1 | 6/2019 | Brouk et al. |
| 2020/0090905 A1 | 3/2020 | Brouk et al. |
| 2020/0203128 A1 | 6/2020 | Fairbairn et al. |
| 2021/0005428 A1 | 1/2021 | Shaw et al. |
| 2021/0013006 A1* | 1/2021 | Nguyen ............ H01J 37/32128 |
| 2021/0074513 A1 | 3/2021 | Van Zyl et al. |
| 2021/0134562 A1 | 5/2021 | Fairbairn et al. |
| 2021/0202209 A1 | 7/2021 | Van Zyl et al. |
| 2021/0241996 A1 | 8/2021 | Carter et al. |
| 2021/0327679 A1 | 10/2021 | Carter et al. |
| 2021/0351007 A1 | 11/2021 | Carter |
| 2022/0157555 A1 | 5/2022 | Carter et al. |
| 2022/0285131 A1 | 9/2022 | Shaw et al. |

FOREIGN PATENT DOCUMENTS

| | | |
|---|---|---|
| CN | 101685772 A | 3/2010 |
| CN | 201465987 U | 5/2010 |
| CN | 101835334 A | 9/2010 |
| CN | 102217045 A | 10/2011 |
| CN | 102405512 A | 4/2012 |
| CN | 105097404 A | 11/2015 |
| CN | 106920729 A | 7/2017 |
| CN | 111788655 A | 10/2020 |
| CN | 114222958 A | 3/2022 |
| EP | 0 383 570 A2 | 8/1990 |
| EP | 1 978 542 A1 | 10/2008 |
| EP | 1 129 481 B1 | 2/2012 |
| GB | 2 382 459 A | 5/2003 |
| GB | 2 400 613 A | 10/2004 |
| JP | 60-126832 A | 7/1985 |
| JP | S62-125626 A | 6/1987 |
| JP | 2141572 A | 5/1990 |
| JP | H2-141572 A | 5/1990 |
| JP | H4-193329 A | 7/1992 |
| JP | H6-243992 A | 9/1994 |
| JP | H9-293600 A | 11/1997 |
| JP | H1-1087097 A | 3/1999 |
| JP | 2001-237234 A | 8/2001 |
| JP | 2001-525601 A | 12/2001 |
| JP | 2002-050611 A | 2/2002 |
| JP | 2003-133404 A | 5/2003 |
| JP | 2004-085446 A | 3/2004 |
| JP | 2004-193564 A | 7/2004 |
| JP | 2005-527078 A | 9/2005 |
| JP | 2005-534187 A | 11/2005 |
| JP | 2006-147269 A | 6/2006 |
| JP | 2006-286254 A | 10/2006 |
| JP | 2007-311182 A | 11/2007 |
| JP | 2007-336148 A | 12/2007 |
| JP | 2008-501224 A | 1/2008 |
| JP | 2008-157906 A | 7/2008 |

(56) References Cited

FOREIGN PATENT DOCUMENTS

| | | |
|---|---|---|
| JP | 2009-071133 A | 4/2009 |
| JP | 2009-514176 A | 4/2009 |
| JP | 2009-540569 A | 11/2009 |
| JP | 2010-103465 A | 5/2010 |
| JP | 2010-219026 A | 9/2010 |
| JP | 2010-238960 A | 10/2010 |
| JP | 2011-519115 A | 6/2011 |
| JP | 2011-222292 A | 11/2011 |
| JP | 2012-104382 A | 5/2012 |
| JP | 2016-500132 A | 1/2016 |
| JP | 6141478 B2 | 6/2017 |
| JP | 6203476 B2 | 9/2017 |
| JP | 2021-503700 A | 2/2021 |
| JP | 2021-503702 A | 2/2021 |
| JP | 2022-541004 A | 9/2022 |
| KR | 10-2012-0019428 A | 3/2012 |
| KR | 10-1800623 B1 | 11/2017 |
| TW | 514967 B | 12/2002 |
| TW | 200811905 A | 3/2008 |
| TW | 200915375 A | 4/2009 |
| TW | 200952560 A | 12/2009 |
| TW | 201142068 A | 12/2011 |
| TW | 201415522 A | 4/2014 |
| TW | 201614097 A | 4/2016 |
| TW | 201621974 A | 6/2016 |
| TW | 201637069 A | 10/2016 |
| WO | 91/09150 A1 | 6/1991 |
| WO | 02/15222 A2 | 2/2002 |
| WO | 2004/012220 A2 | 2/2004 |
| WO | 2004/114461 A2 | 12/2004 |
| WO | 2010/013476 A1 | 2/2010 |
| WO | 2010/080421 A2 | 7/2010 |
| WO | 2010126893 A2 | 11/2010 |
| WO | 2012/007483 A1 | 1/2012 |
| WO | 2012/030500 A1 | 3/2012 |
| WO | 2012103101 A1 | 8/2012 |
| WO | 2013/016619 A1 | 1/2013 |
| WO | 2014/035889 A1 | 3/2014 |
| WO | 2014/035897 A1 | 3/2014 |
| WO | 2017/126184 A1 | 7/2017 |
| WO | 2021/231035 A1 | 11/2021 |

OTHER PUBLICATIONS

Non Final Office Action received for U.S. Appl. No. 13/596,976 dated Nov. 25, 2016, 20 pages.
Non Final Office Action received for U.S. Appl. No. 13/597,032 dated Jun. 20, 2014, 42 pages.
Non Final Office Action received for U.S. Appl. No. 13/597,050 dated Jul. 17, 2015, 86 pages.
Non Final Office Action received for U.S. Appl. No. 13/597,093 dated Nov. 5, 2015, 76 pages.
Non Final Office Action received for U.S. Appl. No. 13/597,093 dated Nov. 10, 2016, 23 pages.
Non Final Office Action received for U.S. Appl. No. 14/011,305 dated Dec. 4, 2014, 28 pages.
Non Final Office Action received for U.S. Appl. No. 14/606,857 dated Apr. 8, 2015, 51 pages.
Non Final Office Action received for U.S. Appl. No. 14/740,955 dated Feb. 2, 2016, 16 pages.
Non Final Office Action received for U.S. Appl. No. 14/803,815 dated Jul. 3, 2018, 67 pages.
Non Final Office Action received for U.S. Appl. No. 15/667,239 dated Jun. 24, 2020, 131 pages.
Non Final Office Action received for U.S. Appl. No. 16/193,790 dated Sep. 4, 2019, 86 pages.
Non Final Office Action received for U.S. Appl. No. 16/194,104 dated Aug. 1, 2019, 83 pages.
Non Final Office Action received for U.S. Appl. No. 16/194,125 dated Dec. 12, 2019, 88 pages.
Non Final Office Action received for U.S. Appl. No. 16/278,822 dated Aug. 2, 2021, 107 pages.
Non Final Office Action received for U.S. Appl. No. 16/278,822 dated Sep. 14, 2022, 9 pages.
Non Final Office Action received for U.S. Appl. No. 16/557,209 dated May 12, 2022, 30 pages.
Non Final Office Action received for U.S. Appl. No. 16/926,876 dated Sep. 26, 2022, 7 pages.
Non Final Office Action received for U.S. Appl. No. 16/926,876 dated Sep. 29, 2022, 80 pages.
Non-Final Office Action received for U.S. Appl. No. 17/150,633 dated Nov. 24, 2021, 52 pages.
Non-Final Office Action received for U.S. Appl. No. 15/495,513 dated Jul. 2, 2020, 87 pages.
Non-Final Office Action received for U.S. Appl. No. 16/246,996 dated Dec. 12, 2019, 85 pages.
Non-Final Office Action received for U.S. Appl. No. 16/270,391 dated Dec. 12, 2019, 78 pages.
Non-Final Office Action received for U.S. Appl. No. 16/803,020 dated Apr. 22, 2020, 36 pages.
Non-Final Office Action received for U.S. Appl. No. 16/896,709 dated May 25, 2021, 50 pages.
Non-Final Office Action received for U.S. Appl. No. 17/031,027 dated Apr. 28, 2021, 29 pages.
Non-Final Office Action received for U.S. Appl. No. 17/171,164 dated Oct. 15, 2021, 59 pages.
Notice of Allowance received for U.S. Appl. No. 12/767,775 dated Jan. 22, 2016, 50 pages.
Notice of Allowance received for U.S. Appl. No. 12/870,837 dated Feb. 12, 2016, 6 pages.
Notice of Allowance received for U.S. Appl. No. 12/870,837 dated Jan. 20, 2016, 37 pages.
Notice of Allowance received for U.S. Appl. No. 13/193,299 dated Jul. 6, 2016, 6 pages.
Notice of Allowance received for U.S. Appl. No. 13/193,299 dated May 20, 2016, 9 pages.
Notice of Allowance received for U.S. Appl. No. 13/193,345 dated Feb. 4, 2016, 16 pages.
Notice of Allowance received for U.S. Appl. No. 13/193,345 dated Mar. 7, 2016, 8 pages.
Notice of Allowance received for U.S. Appl. No. 13/596,976 dated Jul. 31, 2017, 6 pages.
Notice of Allowance received for U.S. Appl. No. 13/596,976 dated May 8, 2017, 17 pages.
Notice of Allowance received for U.S. Appl. No. 13/596,976 dated May 17, 2017, 6 pages.
Notice of Allowance received for U.S. Appl. No. 13/597,032 dated Aug. 28, 2015, 41 pages.
Notice of Allowance received for U.S. Appl. No. 13/597,050 dated Apr. 13, 2016, 15 pages.
Notice of Allowance received for U.S. Appl. No. 13/597,050 dated Apr. 20, 2016, 6 pages.
Notice of Allowance received for U.S. Appl. No. 13/597,093 dated Apr. 19, 2017, 2 pages.
Notice of Allowance received for U.S. Appl. No. 13/597,093 dated Mar. 17, 2017, 13 pages.
Notice of Allowance received for U.S. Appl. No. 14/011,305 dated Jun. 5, 2015, 24 pages.
Notice of Allowance received for U.S. Appl. No. 14/606,857 dated Sep. 24, 2015, 31 pages.
Notice of Allowance received for U.S. Appl. No. 15/495,513 dated Jul. 26, 2021, 18 pages.
Notice of Allowance received for U.S. Appl. No. 15/495,513 dated Oct. 27, 2021, 8 pages.
Notice of Allowance received for U.S. Appl. No. 15/667,239 dated Jan. 13, 2021, 26 pages.
Notice of Allowance received for U.S. Appl. No. 16/193,790 dated Jan. 23, 2020, 16 pages.
Notice of Allowance received for U.S. Appl. No. 16/193,790 dated Nov. 20, 2019, 40 pages.
Notice of Allowance received for U.S. Appl. No. 16/194,104 dated Mar. 2, 2020, 55 pages.
Office Action received for Korean Patent Application Serial No. 1020147004544 dated Feb. 3, 2016, 13 pages.

(56) References Cited

OTHER PUBLICATIONS

Office Action received for Korean Patent Application Serial No. 1020157006726 dated Feb. 19, 2018, 10 pages.
Office Action received for Korean Patent Application Serial No. 1020157007273 dated Jan. 30, 2018, 8 pages.
Office Action received for Korean Patent Application Serial No. 1020157007516 dated Feb. 15, 2017, 18 pages.
Office Action received for Taiwan Patent Application Serial No. 107140922 dated Feb. 1, 2021, 9 pages.
Office Action received for Taiwan Patent Application Serial No. 110136912 dated Feb. 23, 2022, 10 pages.
Office Action received for Taiwanese Patent Application Serial No. 102130565 dated Apr. 11, 2016, 2 pages.
Office Action received for Taiwanese Patent Application Serial No. 099113815 dated Jan. 27, 2014, 6 pages.
Office Action received for Taiwanese Patent Application Serial No. 099113815 dated Jun. 18, 2014, 5 pages.
Office Action received for Taiwanese Patent Application Serial No. 101127182 dated Aug. 11, 2014, 11 pages.
Office Action received for Taiwanese Patent Application Serial No. 102130565 dated Aug. 20, 2015, 4 pages.
Office Action received for Taiwanese Patent Application Serial No. 102130565 dated Jul. 14, 2015, 4 pages.
Office Action received for Taiwanese Patent Application Serial No. 102130984 dated Feb. 19, 2016, 4 pages.
Office Action received for Taiwanese Patent Application Serial No. 107140924 dated Apr. 28, 2020, 14 pages.
Office Action Received for Taiwanese Patent Application Serial No. 107140924 dated Jan. 15, 2021, 12 pages.
Office Action received for Taiwanese Patent Application Serial No. 107140926 dated May 28, 2020, 12 pages.
Office Action received for Taiwanese Patent Application Serial No. 10714924 dated Aug. 18, 2021, 5 pages.
Office Action received for Taiwanese Patent Application Serial No. Re: Taiwan Patent Application No. 110111617 dated Jun. 30, 2022, 8 pages.
Office Action rereceived for Japanese Patent Application Serial No. 2012508593 dated Sep. 11, 2013, 7 pages.
Ohachi, T., et al., "Measurement of Nitrogen Atomic Flux for RF-MBE Growth of GaN and AIN on Si Substrates", J. of Crystal Growth, vol. 311, 2009, pp. 2987-2991.
Raoux, S., et al., "Remote Microwave Plasma Source for Cleaning Chemical Vapor Deposition Chambers; Technology for Reducing Global Warming Gas Emissions", J. Vac. Sci. Technol. B, vol. 17, No. 2, Mar./Apr. 1999, pp. 477-485.
Rauf, S., et al.., "Nonlinear Dynamics of Radio Frequency Plasma Processing Reactors Powered by Multifrequency Sources", IEEE Transactions on Plasma Science, vol. 27, No. 5, Oct. 5, 1999, pp. 1329-1338.
Requirement for Restriction received for U.S. Appl. No. 12/870,837 dated Dec. 19, 2012, 8 pages.
Requirement for Restriction received for U.S. Appl. No. 13/193,299 dated Aug. 8, 2013, 7 pages.
Requirement for Restriction received for U.S. Appl. No. 13/193,345 dated Jun. 6, 2013, 8 pages.
Requirement for Restriction received for U.S. Appl. No. 13/596,976 dated Feb. 23, 2015, 8 pages.
Requirement for Restriction received for U.S. Appl. No. 13/597,050 dated Jan. 27, 2015, 7 pages.
Requirement for Restriction received for U.S. Appl. No. 13/597,093 dated Mar. 23, 2015, 9 pages.
Requirement for Restriction received for U.S. Appl. No. 14/011,305 dated Aug. 15, 2014, 14 pages.
Requirement for Restriction received for U.S. Appl. No. 14/803,815 dated Nov. 17, 2017, 8 pages.
Requirement for Restriction received for U.S. Appl. No. 15/495,513 dated Nov. 29, 2019, 6 pages.
Requirement for Restriction received for U.S. Appl. No. 15/667,239 dated Dec. 23, 2019, 6 pages.
Requirement for Restriction received for U.S. Appl. No. 16/557,209 dated Sep. 21, 2021, 6 pages.
Requirement for Restriction received for U.S. Appl. No. 16/926,876 dated Apr. 29, 2022, 9 pages.
Second Office Action received for Chinese Patent Application Serial No. 201080003206.X dated May 23, 2014, 6 pages.
Second Office Action received for Chinese Patent Application Serial No. 201710704712.5 dated Sep. 27, 2019, 11 pages.
Second Office Action received for Chinese Patent Application Serial No. 201711336133.6 dated Jan. 6, 2020, 7 pages.
Silapunt, R., et al., "Ion Bombardment Energy Control for Selective Fluorocarbon Plasma Etching of Organosilicate Glass", J. Vac. Sci. Technol, vol. B 22, No. 2, 2004, pp. 826-831.
Specification for related U.S. Appl. No. 13/173,752, filed Jun. 30, 2011, 48 pages.
Specification for related U.S. Appl. No. 13/425,159, filed Mar. 20, 2012, 33 pages.
Third Office Action received for Chinese Patent Application Serial No. 201080003206.X dated Nov. 26, 2014, 6 pages.
Third Office Action received for Chinese Patent Application Serial No. 201710704712.5 dated Jan. 3, 2020, 8 pages.
Third Office Action received for Chinese Patent Application Serial No. 201711336133.6 dated Oct. 10, 2020, 21 pages.
Vahedi, V., et al., "Verification of Frequency Scaling Laws for Capacitive Radio-Frequency Discharges Using Two-Dimensional Simulations", Phys. Fluids B, , vol. 5, No. 7, Jul. 1993, pp. 2719-2729.
Wakeham, S.J., et al.., "Low Temperature Remote Plasma Sputtering of Indium Tin Oxide for Flexible Display Applications", Thin Solid Films, vol. 519, 2009, pp. 1355-1358.
Wang, S.B., et al., "Control of Ion Energy Distribution at Substrates During Plasma Processing", J. Applied Physics, vol. 88, No. 2, Jul. 15, 2000, pp. 643-646.
Wendt "Thomson Innovation Patent Export", Mar. 10, 2009, 10 pages.
Xiubo, et al., "Charging of Dielectric Substrate Materials During Plasma Immersion Ion Implantation", Nuclear Instruments and Methods in Physics Research B, vol. 187, 2002, pp. 485-491.
Yun, Y.B., et al., "Effects of Various Additive Gases on Chemical Dry Etching Rate Enhancement of Low-k SiOCH Layer in F2/Ar Remote Plasmas", Thin Solid Films, vol. 516, 2008, pp. 3549-3553.
Notice of Allowance received for U.S. Appl. No. 16/194,104 dated Mar. 27, 2020, 37 pages.
Notice of Allowance received for U.S. Appl. No. 16/194,125 dated Jun. 18, 2020, 42 pages.
Notice of Allowance received for U.S. Appl. No. 16/246,996 dated Jun. 18, 2020, 27 pages.
Notice of Allowance received for U.S. Appl. No. 16/270,391 dated Jun. 16, 2020, 36 pages.
Notice of Allowance received for U.S. Appl. No. 16/278,822 dated Dec. 1, 2022, 13 pages.
Notice of Allowance received for U.S. Appl. No. 16/803,020 dated Sep. 14, 2020, 100 pages.
Notice of Allowance received for U.S. Appl. No. 16/896,709 dated Nov. 17, 2021, 46 pages.
Notice of Allowance received for U.S. Appl. No. 17/031,027 dated Feb. 3, 2022, 8 pages.
Notice of Allowance received for U.S. Appl. No. 17/031,027 dated Oct. 20, 2021, 81 pages.
Notice of Allowance received for U.S. Appl. No. 17/150,633 dated Nov. 15, 2022, 42 pages.
Notice of Allowance received for U.S. Appl. No. 17/171,164 dated Jun. 8, 2022, 13 pages.
Notice of Allowance received for U.S. Appl. No. 17/171,164 dated May 4, 2022, 38 pages.
Notice of Allowance received for U.S. Appl. No. 17/584,921 dated Nov. 16, 2022, 9 pages.
Notice of Final Rejection received for Japanese Patent Application Serial No. 2013547731 dated Jul. 28, 2015, 13 pages.
Notice Of Grounds For Rejection received for Korean Patent Application Serial No. 1020157007771 dated May 31, 2018, 4 pages.

(56) References Cited

OTHER PUBLICATIONS

Notice Of Grounds For Rejection received for Korean Patent Application Serial No. 1020177033224 dated Aug. 6, 2018, 7 pages.
Notice Of Grounds For Rejection received for Korean Patent Application Serial No. 1020187029468 dated Feb. 7, 2019, 6 pages.
Notice of Reasons for Rejection received for Japanese Patent Application Serial No. 2013547731 dated Sep. 30, 2014, 8 pages.
Notice of Reasons for Rejection received for Japanese Patent Application Serial No. 2017091857 dated Feb. 2, 2018, 10 pages.
Notice of Reasons for Rejection received for Japanese Patent Application Serial No. 2020081092 dated Apr. 1, 2021, 6 pages.
Notice of Reasons for Rejection received for Japanese Patent Application Serial No. 2020545048 dated Aug. 19, 2022, 12 pages.
Office Action received for Chinese Patent Application Serial No. 201180046783.1 dated Dec. 7, 2016, 9 pages.
Office Action received for Chinese Patent Application Serial No. 201180046783.1 dated Dec. 8, 2015, 9 pages.
Office Action received for Chinese Patent Application Serial No. 201180046783.1 dated May 17, 2016, 8 pages.
Office Action received for Chinese Patent Application Serial No. 201280047162.X dated Apr. 26, 2016, 7 pages.
Office Action received for Chinese Patent Application Serial No. 201280047162.X dated Oct. 24, 2016, 31 pages.
Office Action received for Chinese Patent Application Serial No. 201380056068.5 dated Jun. 12, 2017, 16 pages.
Office Action received for Chinese Patent Application Serial No. 201380056068.5 dated Oct. 17, 2016, 15 pages.
Office Action received for Chinese Patent Application Serial No. 201380056070.2 dated Apr. 2, 2018, 6 pages.
Office Action received for Chinese Patent Application Serial No. 201380056070.2 dated Aug. 15, 2016, 25 pages.
Office Action received for Chinese Patent Application Serial No. 201380056070.2 dated Jul. 11, 2017, 13 pages.
Office Action received for European Patent Application Serial No. 10770205.2 dated Nov. 2, 2017, 30 pages.
Office Action received for European Patent Application Serial No. 10770205.2 dated Oct. 22, 2019, 6 pages.
Office Action received for European Patent Application Serial No. 11822326.2 dated Apr. 3, 2017, 4 pages.
Office Action received for European Patent Application Serial No. 11822326.2 dated Feb. 27, 2018, 5 pages.
Office Action received for European Patent Application Serial No. 11822326.2 dated Oct. 18, 2018, 6 pages.
Office Action received for Japanese Patent Application Serial No. 2012508593 dated Apr. 19, 2013, 11 pages.
Office Action received for Japanese Patent Application Serial No. 2013527088 dated Apr. 21, 2015, 10 pages.
Office Action received for Japanese Patent Application Serial No. 2014523057 dated Apr. 21, 2015, 11 pages.
Office Action received for Japanese Patent Application Serial No. 2015529905 dated Aug. 22, 2017, 16 pages.
Office Action received for Japanese Patent Application Serial No. 2015529905 dated Aug. 24, 2017, 14 pages.
Office Action received for Japanese Patent Application Serial No. 2015529906 dated May 16, 2017, 13 pages.
Office Action received for Japanese Patent Application Serial No. 2015529939 dated Sep. 19, 2017, 19 pages.
Office Action received for Japanese Patent Application Serial No. 2016-043215 dated Jan. 25, 2017, 7 pages.
Office Action received for Japanese Patent Application Serial No. 2018081644 dated Apr. 16, 2019, 21 pages.
Office Action received for Japanese Patent Application Serial No. 2018138425 dated Mar. 24, 2020, 7 pages.
Office Action received for Japanese Patent Application Serial No. 2018138425 dated May 22, 2019, 10 pages.
Office Action received for Japanese Patent Application Serial No. 20205545044 dated Aug. 25, 2022, 6 pages.
Office Action received for Korean Patent Application Serial No. 1020117009075 dated Mar. 25, 2013, 2 pages.
Office Action received for Korean Patent Application Serial No. 1020137007594 dated Jul. 28, 2014, 2 pages.
Office Action received for Korean Patent Application Serial No. 1020137019332 dated May 29, 2015, 18 pages.
Bruno, G., et al., "Real Time Ellipsometry for Monitoring Plasma-Assisted Epitaxial Growth of GaN", Applied Surface Sci., vol. 253, 2006, pp. 219-223.
Bruno, James, "Use of Simulation for Examining the Effects of Guessing Upon Knowledge Assessment on Standardized Tests", "Conference Proceedings of the 10th Conference on Winter Simulation, Miami, FL", 1978, vol. 2, pp. 759-765.
Bryns, B., et al.., "A VHF Driven Coaxial Atmospheric Air Plasma: Electrical and Optical Characterization", Dep't of Nuclear Engr., 2011, pp. 1-18.
Buzzi, F.L., et al., "Energy Distribution of Bombarding Ions in Plasma Etching of Dielectrics", "AVS 54th International Symposium", Oct. 15, 2007, 18 pages.
Communication pursuant to Article 94(3) EPC received for European Patent Application Serial No. 10770205.2 dated Jun. 8, 2021, 6 pages.
Communication Pursuant To Article 94(3) EPC received for European Patent Application Serial No. 10770205.2 dated Oct. 23, 2020, 4 pages.
Decision Of Rejection received for Chinese Patent Application Serial No. 201710704712.5 dated Aug. 10, 2020, 8 pages.
Decision of Rejection received for Korean Patent Application Serial No. 1020137019332 dated Jan. 20, 2016, 6 pages.
Emsellem, G., "Electrodeless Plasma Thruster Design Characteristics", 41st Joint Propulsion Conference, Jul. 11, 2005, 22 pages.
European Search Report received for European Patent Application Serial No. EP11822326 dated Oct. 9, 2015, 3 pages.
M. Hochstrasser, International Search Report, dated Mar. 4, 2023, European Patent Office.
Extended European Search Report received for European Patent Application Serial No. 18877737.9 dated Aug. 25. 2021, 165 pages.
Extended European Search Report received for European Patent Application Serial No. 10770205.2 dated Jan. 30, 2013, 8 pages.
Extended European Search Report received for European Patent Application Serial No. 18877322.0 dated Sep. 14, 2021, 129 pages.
Extended European Search Report received for European Patent Application Serial No. 18878531.5 dated Sep. 1, 2021, 126 pages.
Final Office Action received for U.S. Appl. No. 17/150,633 dated Jul. 27, 2022, 48 pages.
Final Office Action received for U.S. Appl. No. 12/767,775 dated Dec. 15, 2014, 37 pages.
Final Office Action received for U.S. Appl. No. 12/767,775 dated Sep. 10, 2013, 30 pages.
Final Office Action received for U.S. Appl. No. 12/870,837 dated Dec. 20, 2013, 33 pages.
Final Office Action received for U.S. Appl. No. 13/193,299 dated Dec. 4, 2015, 30 pages.
Final Office Action received for U.S. Appl. No. 13/193,299 dated Sep. 26, 2014, 37 pages.
Final Office Action received for U.S. Appl. No. 13/193,345 dated Jan. 15, 2016, 33 pages.
Final Office Action received for U.S. Appl. No. 13/193,345 dated Jul. 7, 2014, 26 pages.
Final Office Action received for U.S. Appl. No. 13/596,976 dated Apr. 5, 2017, 23 pages.
Final Office Action received for U.S. Appl. No. 13/596,976 dated Jul. 1, 2016, 34 pages.
Final Office Action received for U.S. Appl. No. 13/597,032 dated Apr. 9, 2015, 32 pages.
Final Office Action received for U.S. Appl. No. 13/597,050 dated Mar. 10, 2016, 19 pages.
Final Office Action received for U.S. Appl. No. 13/597,093 dated Jul. 8, 2016, 25 pages.
Final Office Action received for U.S. Appl. No. 14/803,815 dated Mar. 12, 2019, 15 pages.
Final Office Action received for U.S. Appl. No. 15/495,513 dated Apr. 14, 2021, 20 pages.
Final Office Action received for U.S. Appl. No. 16/278,822 dated Feb. 15, 2022, 52 pages.

(56) References Cited

OTHER PUBLICATIONS

First Office Action received for Chinese Patent Application Serial No. 201080003206.X dated Sep. 4, 2013, 15 pages.
First Office Action received for Chinese Patent Application Serial No. 201180046783.1 dated Mar. 24, 2015, 18 pages.
First Office Action received for Chinese Patent Application Serial No. 201280047162.X dated Sep. 6, 2015, 18 pages.
First Office Action received for Chinese Patent Application Serial No. 20171074712.5 dated Feb. 22, 2019, 9 pages.
First Office Action received for Chinese Patent Application Serial No. 201711336133.6 dated Mar. 4, 2019, 16 pages.
Fourth Office Action received for Chinese Patent Application Serial No. 201080003206.X dated Jun. 10, 2015, 8 pages.
Fourth Office Action received for Chinese Patent Application Serial No. 201710704712.5 dated Apr. 1, 2020, 7 pages.
Gangoli, S.P., et al., "Production and transport chemistry of atomic fluorine in remote plasma source and cylindrical reaction chamber", J. Phys. D: Appl. Phys., vol. 40, Aug. 16, 2007, pp. 5140-5154.
George, M.A., et al., "Silicon Nitride Arc Thin Films by New Plasma Enhanced Chemical Vapor Deposition Source Technology", Article downloaded from www.generalplasma.com, Jul. 7, 2011, pp. 1-5.
Giangregorio, M.M., et al., "Role of Plasma Activation in Tailoring the Nanostructure of Multifunctional Oxides Thin3 Films", Applied Surface Sci., vol. 255, Sep. 10, 2008, pp. 5396-5400.
Heil, S.B.S., et al., "Deposition of TiN and HfO2 in a Commercial 200mm Plasma Atomic Layer Deposition Reactor", J. Vac. Sci. Technol. A, Sep./Oct. 2007, Jul. 31, 2007, vol. 25, No. 5, pp. 1357-1366.
Honda, S., et al., "Hydrogenation of Polycrystalline Silicon Thin Films", Thin Solid Films, vol. 501, Oct. 5, 2005, pp. 144-148.
International Preliminary Report on Patentability Chapter I received for International PCT Application Serial No. PCT/US2020/041771 dated Jan. 27, 2022, 10 pages.
International Preliminary Report on Patentability received for International PCT Application Serial No. PCT/US2010/032582 dated Nov. 10, 2011, 8 pages.
International Preliminary Report on Patentability received for International PCT Application Serial No. PCT/US2011/047467 dated Mar. 14, 2013, 7 pages.
International Preliminary Report on Patentability received for International PCT Application Serial No. PCT/US2012/020219 dated Jul. 18, 2013, 7 pages.
International Preliminary Report on Patentability received for International PCT Application Serial No. PCT/US2012/048504 dated Feb. 6, 2014, 11 pages.
International Preliminary Report on Patentability received for International PCT Application Serial No. PCT/US2013/056634 dated Mar. 12, 2015, 7 pages.
International Preliminary Report on Patentability received for International PCT Application Serial No. PCT/US2013/056647 dated Mar. 12, 2015, 7 pages.
International Preliminary Report on Patentability received for International PCT Application Serial No. PCT/US2013/056657 dated Mar. 12, 2015, 8 pages.
International Preliminary Report on Patentability received for International PCT Application Serial No. PCT/US2013/056659 dated Mar. 12, 2015, 8 pages.
International Preliminary Report on Patentability received for International PCT Application Serial No. PCT/US2013/056851 dated Mar. 12, 2015, 8 pages.
International Preliminary Report On Patentability Received for International PCT Application Serial No. PCT/US2018/061653 dated May 28, 2020, 9 pages.
International Preliminary Report on Patentability received for International PCT Application Serial No. PCT/US2018/061671 dated May 28, 2020, 14 pages.
International Preliminary Report on Patentability received International Application Serial No. PCT/US2018/061575 dated May 28, 2020, 9 pages.
International Search Report and Writen Opinion received for International PCT Application Serial No. PCT/US2012/048504 dated Sep. 17, 2012, 13 pages.
International Search Report And Written Opinion received for International Application Serial No. PCT/US2020/027927 dated Sep. 17, 2021, 14 pages.
International Search Report and Written Opinion received for International PCT Application Serial No. PCT/US2010/032582 dated Feb. 21, 2011, 10 pages.
International Search Report and Written Opinion received for International PCT Application Serial No. PCT/US2011/047467 dated Nov. 24, 2011, 9 pages.
International Search Report and Written Opinion received for International PCT Application Serial No. PCT/US2012/022380 dated Mar. 14, 2012, 11 pages.
International Search Report and Written Opinion received for International PCT Application Serial No. PCT/US2012/029953 dated May 28, 2012, 11 pages.
International Search Report and Written Opinion received for International PCT Application Serial No. PCT/US2012/20219 dated Feb. 22, 2012, 10 pages.
International Search Report and Written Opinion received for International PCT Application Serial No. PCT/US2013/056634 dated Nov. 15, 2013, 10 pages.
International Search Report and Written Opinion received for International PCT Application Serial No. PCT/US2013/056647 dated Oct. 30, 2013, 10 pages.
International Search Report and Written Opinion received for International PCT Application Serial No. PCT/US2013/056657 dated Oct. 28, 2013, 11 pages.
International Search Report and Written Opinion received for International PCT Application Serial No. PCT/US2013/056659 dated Nov. 8, 2013, 11 pages.
International Search Report and Written Opinion received for International PCT Application Serial No. PCT/US2013/056851 dated Nov. 18, 2013, 11 pages.
International Search Report and Written Opinion received for International PCT Application Serial No. PCT/US2018/061575 dated Mar. 6, 2019, 12 pages.
International Search Report and Written Opinion received for International PCT Application Serial No. PCT/US2018/061653 dated Mar. 8, 2019, 10 pages.
International Search Report and Written Opinion received for International PCT Application Serial No. PCT/US2018/061671 dated Mar. 13, 2019, 17 pages.
International Search Report and Written Opinion received for International PCT Application Serial No. PCT/US2021/027927 dated Sep. 17, 2021, 9 pages.
International Search Report and Written Opinion received for International PCT Application Serial No. PCT/US2022/014888 dated Mar. 25, 2022, 18 pages.
International Search Report and Written Opinion received for International PCT Application Serial No. PCT/US2022/016278 dated May 17, 2022, 10 pages.
International Search Report and Written Opinion received for International PCT Application Serial No. PCT/US2022/016279 dated Jun. 9, 2022, 8 pages.
International Search Report and Written Opinion received for International PCT Application Serial No. PCT/US2022/040046 dated Oct. 27, 2022, 9 pages.
Jeon, M., et al., "Hydrogenated Amorphous Silicon Film as Intrinsic Passivation Layer Deposited at Various Temperatures using RF remote-PECVD technique", Current Applied Physics, vol. 10, No. 2010, Nov. 12, 2009, pp. S237-S240.
Kim, J.Y., et al., "Remote Plasma Enhanced Atomic Layer Deposition of TiN Thin Films Using Metalorganic Precursor", J. Vac. Sci. Technol. A, vol. 22, No. 1, Jan./Feb. 2004, Nov. 13, 2003, pp. 8-12.
Krolak, M, "Matthew Krolak's MyElectricEngine.Com Megnetoplasmadynamic (MPD) Thruster Design", Webpage downloaded from http://myelectricengine.com/projects/mpdthruster/mpdthruster.html, Apr. 28, 2011, 7 pages.

(56) References Cited

OTHER PUBLICATIONS

Kuo, M.S., et al., "Influence of C4F8/Ar-based etching and H2-based remote plasma ashing processes on ultralow ? Materials Modifications", J. Vac. Sci. Technol. B, vol. 28, No. 2, Mar./Apr. 2010, Mar. 19, 2010, pp. 284-294.

Non Final Office Action received for U.S. Appl. No. 12/767,775 dated Apr. 25, 2013, 28 pages.

Non Final Office Action received for U.S. Appl. No. 12/767,775 dated Jul. 1, 2014, 48 pages.

Non Final Office Action received for U.S. Appl. No. 12/767,775 dated Jun. 17, 2015, 28 pages.

Non Final Office Action received for U.S. Appl. No. 12/767,775 dated Oct. 17, 2012, 33 pages.

Non Final Office Action received for U.S. Appl. No. 12/870,837 dated Apr. 9, 2015, 40 pages.

Non Final Office Action received for U.S. Appl. No. 12/870,837 dated Mar. 22, 2013, 46 pages.

Non Final Office Action received for U.S. Appl. No. 13/193,299 dated Dec. 18, 2013, 43 pages.

Non Final Office Action received for U.S. Appl. No. 13/193,299 dated May 21, 2015, 24 pages.

Non Final Office Action received for U.S. Appl. No. 13/193,345 dated Apr. 16, 2015, 34 pages.

Non Final Office Action received for U.S. Appl. No. 13/193,345 dated Nov. 7, 2013, 36 pages.

Non Final Office Action received for U.S. Appl. No. 13/343,576 dated Nov. 13, 2014, 24 pages.

\* cited by examiner

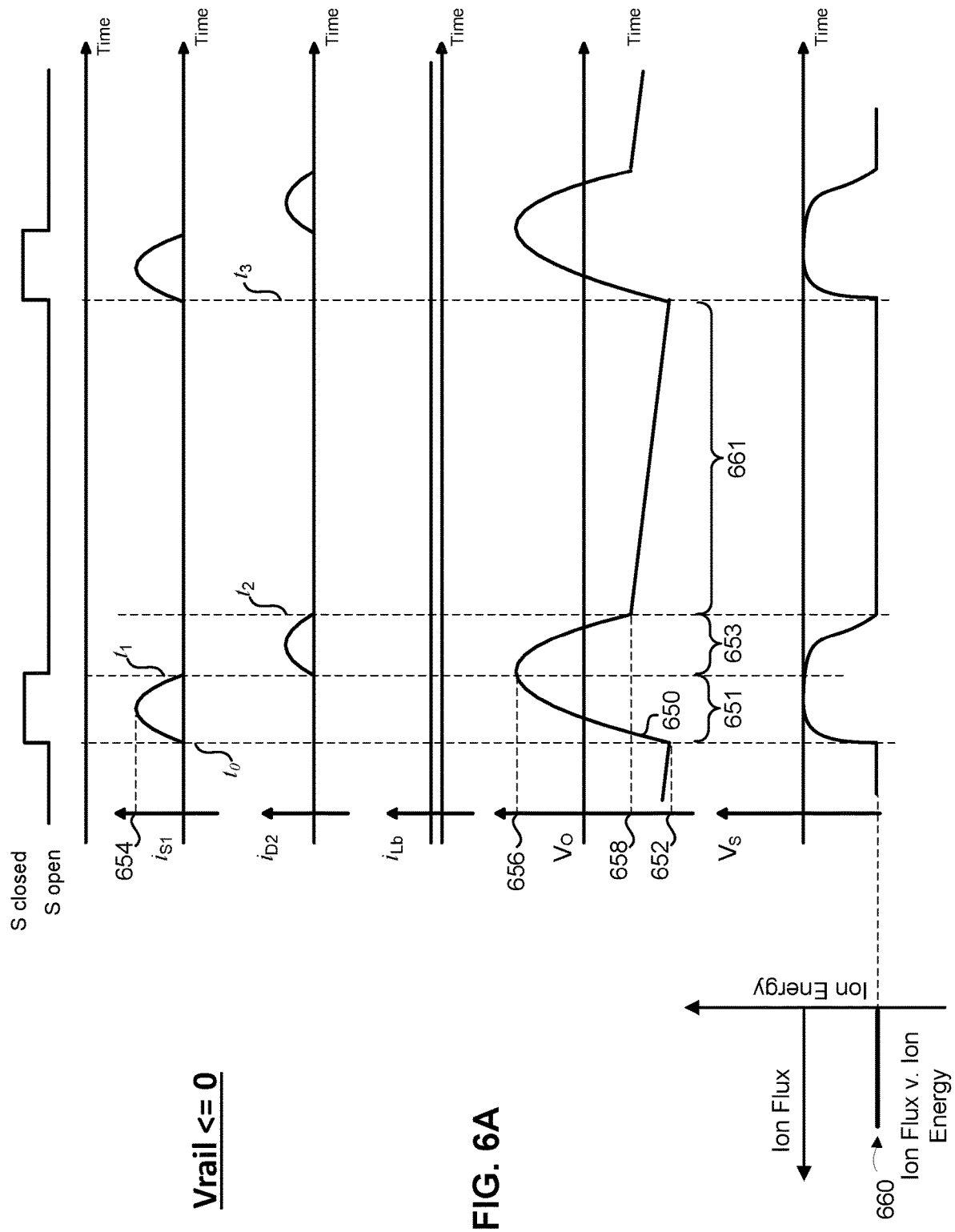

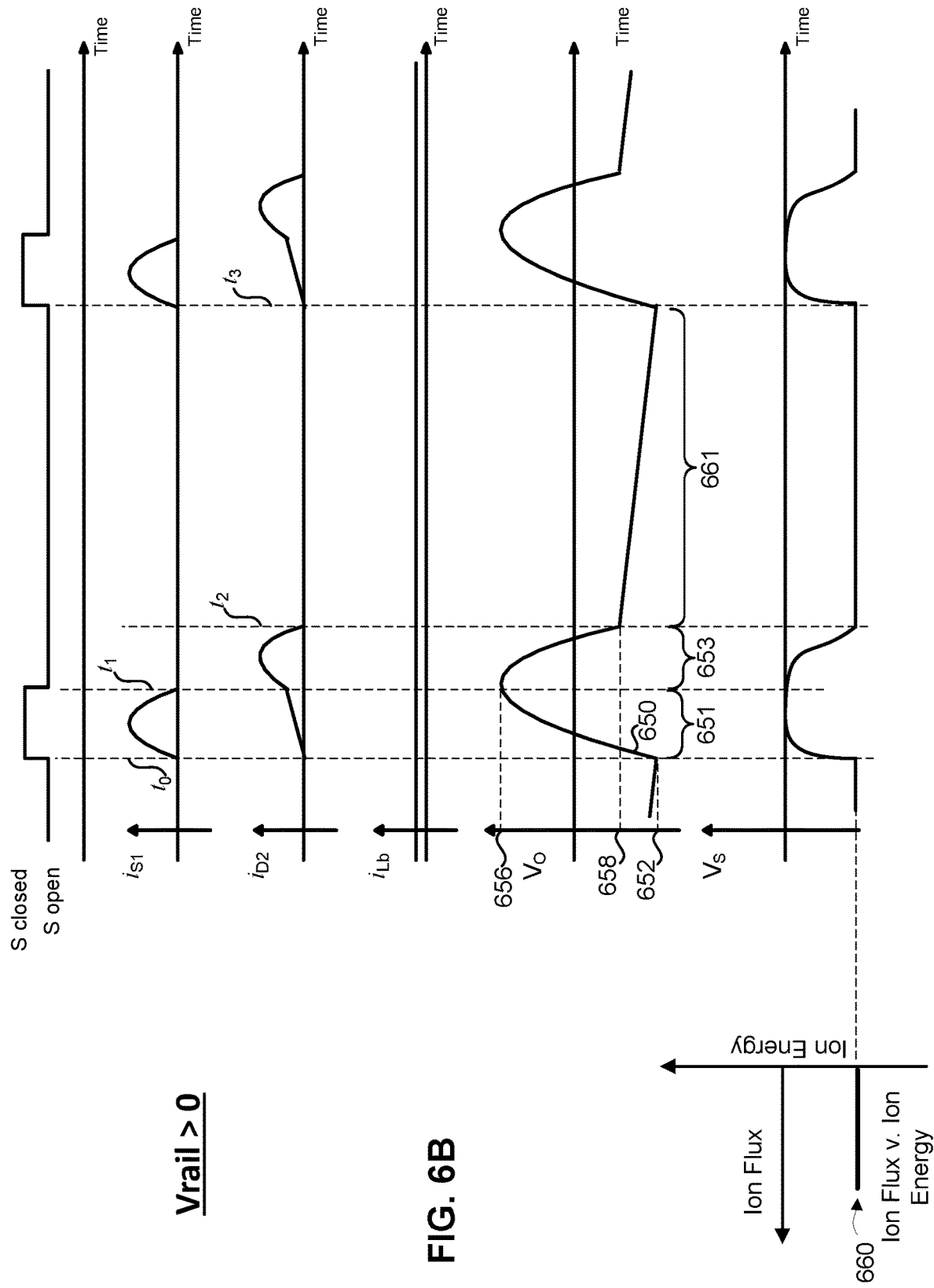

BIAS SUPPLY WITH RESONANT SWITCHING

BACKGROUND

Field

The present invention relates generally to power supplies, and more specifically to power supplies for applying a voltage for plasma processing.

Background

Many types of semiconductor devices are fabricated using plasma-based etching techniques. If it is a conductor that is etched, a negative voltage with respect to ground may be applied to the conductive substrate so as to create a substantially uniform negative voltage across the surface of the substrate conductor, which attracts positively charged ions toward the conductor, and as a consequence, the positive ions that impact the conductor have substantially the same energy.

If the substrate is a dielectric, however, a non-varying voltage is ineffective to place a voltage across the surface of the substrate. But an alternating current (AC) voltage (e.g., high frequency AC or radio frequency (RF)) may be applied to the conductive plate (or chuck) so that the AC field induces a voltage on the surface of the substrate. During the positive peak of the AC cycle, the substrate attracts electrons, which are light relative to the mass of the positive ions; thus, many electrons will be attracted to the surface of the substrate during the positive peak of the cycle. As a consequence, the surface of the substrate will be charged negatively, which causes ions to be attracted toward the negatively-charged surface during the rest of the AC cycle. And when the ions impact the surface of the substrate, the impact dislodges material from the surface of the substrate—effectuating the etching.

In many instances, it is desirable to have a narrow (or specifically tailorable) ion energy distribution, but applying a sinusoidal waveform to the substrate induces a broad distribution of ion energies, which limits the ability of the plasma process to carry out a desired etch profile. Known techniques to achieve a narrow ion energy distribution are expensive, inefficient, difficult to control, and/or may adversely affect the plasma density. As a consequence, many of these known techniques have not been commercially adopted. Accordingly, a system and method are needed to address the shortfalls of present technology and to provide other new and innovative features.

SUMMARY

An aspect may be characterized as a bias supply to apply a periodic voltage comprising an output node, a return node, and a resonant switch section. The resonant switch section comprises a first node, a second node, a third node, and a first current pathway between the first node and the second node, which comprises a series combination of a switch and a diode. The resonant switch section also comprises a second current pathway between the second node and the third node that comprises a diode and an inductive element. A power section of the bias supply comprises a first voltage source coupled between the third node and the first node and a second voltage source coupled to the return node. When the switch is closed, unidirectional current in the first and second current pathways causes an application of the periodic voltage between the output node and the return node.

Another aspect may be characterized as a bias supply comprising an output node, a return node, and a power section coupled to the output node and the return node. The bias supply also comprises a resonant switch section coupled to the power section at a first node, a second node, and a third node wherein the resonant switch section is configured to connect and disconnect a current pathway between the first node and the second node to cause an application of an asymmetric periodic voltage waveform at the output node relative to the return node. Each cycle of the asymmetric periodic voltage waveform includes a first portion that begins with a first negative voltage and changes to a positive peak voltage, a second portion that changes from the positive peak voltage level to a third voltage level and a fourth portion that includes a negative voltage ramp from the third voltage level to a fourth voltage level.

BRIEF DESCRIPTION OF THE DRAWINGS

FIG. 6A includes graphs depicting operational aspects of the bias supplies disclosed herein in an example mode of operation;

FIG. 6B includes graphs depicting operational aspects of the bias supplies disclosed herein in another example mode of operation.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

For the purposes of this disclosure, source generators are those whose energy is primarily directed to generating and sustaining the plasma, while "bias supplies" are those whose energy is primarily directed to generating a surface potential for attracting ions and electrons from the plasma.

Figure 1:
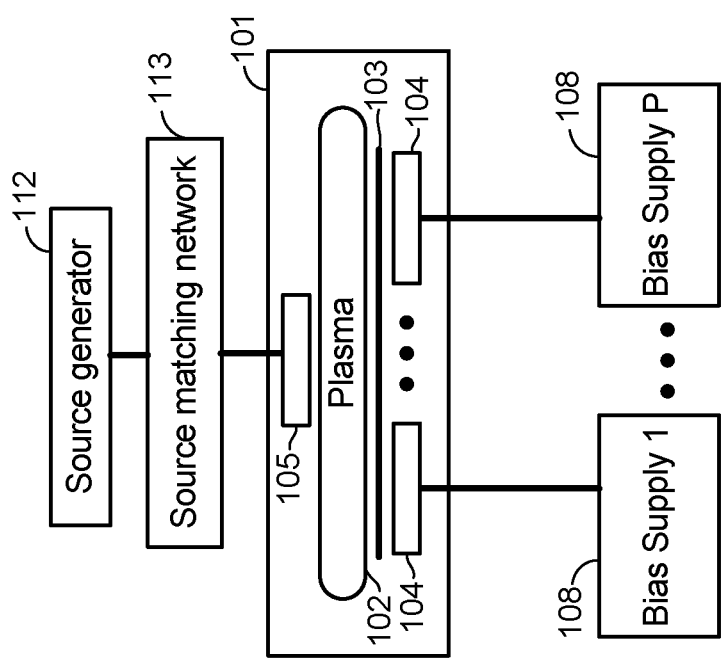
FIG. 1 is a block diagram depicting an exemplary plasma processing environment in which bias supplies disclosed herein may be utilized.

Described herein are several embodiments of novel bias supplies that may be used to apply a periodic voltage function to a substrate support in a plasma processing chamber. Referring first to FIG. 1, shown is an exemplary plasma processing environment (e.g., deposition or etch system) in which bias supplies may be utilized. The plasma processing environment may include many pieces of equipment coupled directly and indirectly to a plasma processing chamber 101, within which a volume containing a plasma 102 and workpiece 103 (e.g., a wafer) and electrodes 104 (which may be embedded in a substrate support) are contained. The equipment may include vacuum handling and gas delivery equipment (not shown), one or more bias supplies 108, one or more source generators 112, and one or more source matching networks 113. In many applications, power from a single source generator 112 is connected to one or multiple source electrodes 105. The source generator 112 may be a higher frequency RF generator (e.g., 13.56 MHz to 120 MHz). The electrode 105 generically represents what may be implemented with an inductively coupled plasma (ICP) source, a dual capacitively-coupled plasma source (CCP) having a secondary top electrode biased at another RF frequency, a helicon plasma source, a microwave plasma source, a magnetron, or some other independently operated source of plasma energy.

In variations of the system depicted in FIG. 1, the source generator 112 and source matching network 113 may be replaced by, or augmented with, a remote plasma source. And other variations of the system may include only a single bias supply 108.

While the following disclosure generally refers to plasma-based wafer processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to affect a surface change, subsurface change, deposition or removal by physical or chemical means.

Figure 2:
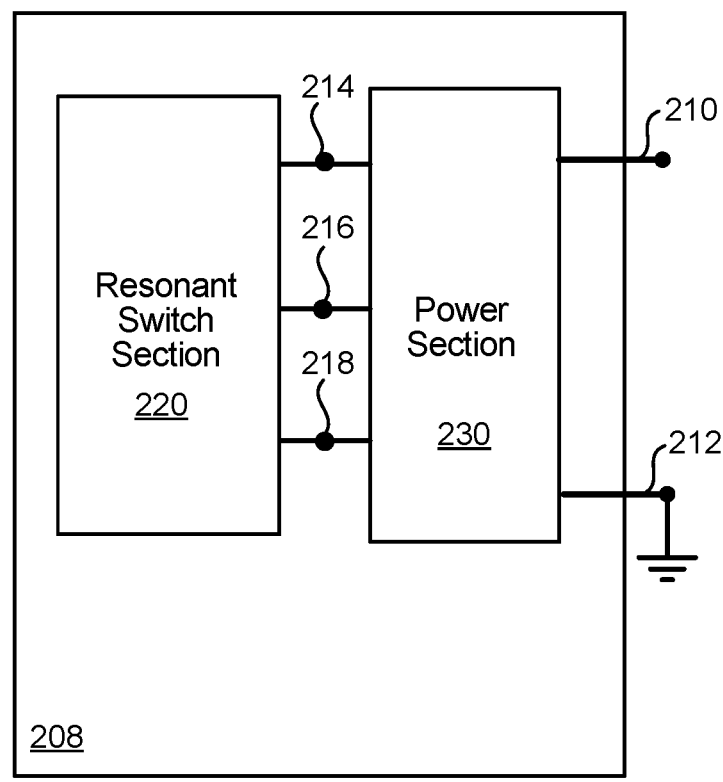
FIG. 2 is a schematic diagram depicting an exemplary bias supply.

Referring to FIG. 2, shown is an exemplary bias supply 208 that may be utilized to implement the bias supplies 108 described with reference to FIG. 1. The bias supply 208 generally represents many variations of bias supplies described further herein with reference to FIGS. 4A, 4B, 4C, 4D, 4E, 4F, and 4G to apply a periodic voltage function. Thus, reference to the bias supply 208 generally refers to the bias supply 208 depicted in FIG. 2 and the bias supplies 408A to 408G described further herein. As shown, the bias supply 208 includes an output 210 (also referred to as an output node 210), a return node 212, a resonant switch section 220 and a power section 230, and the resonant switch section 220 is coupled to the power section 230 at three nodes: a first node 214, a second node 216, and a third node 218. In general, the bias supply 208 functions to apply a periodic voltage function between the output node 210 and the return node 212. Current delivered to a load through the output node 210 is returned to the bias supply 208 through the return node 212 that may be common with the load.

In many implementations as disclosed further herein, the resonant switch section 220 is configured to enable a first current pathway between the first node 214 and the second node 216 to be periodically connected and disconnected, which results in an application of periodic voltage waveform between the output node 210 and the return node 212. For example, the resonant switch section 220 may comprise a controllable switch and one or more inductive elements arranged to provide the first current pathway between the first node 214 and the second node 216 and a second current pathway between the second node 216 and the third node 218. In addition, the first current pathway and the second current pathway may be configured so that current in the first and second current pathways is unidirectional.

As described further herein, the power section 230 may include a combination of one or more voltage sources and inductive elements. Although not depicted in FIG. 2 for clarity and simplicity, the bias supply 208 may be coupled to a controller and/or include a controller that is coupled to the resonant switch section 220 and or the power section 230. Variations of each of the resonant switch section 220 and the power section 230, and details of the interoperation of the resonant switch section 220 with the power section 230, are disclosed further herein, but first, it is helpful to understand aspects of a plasma load.

Figure 3:
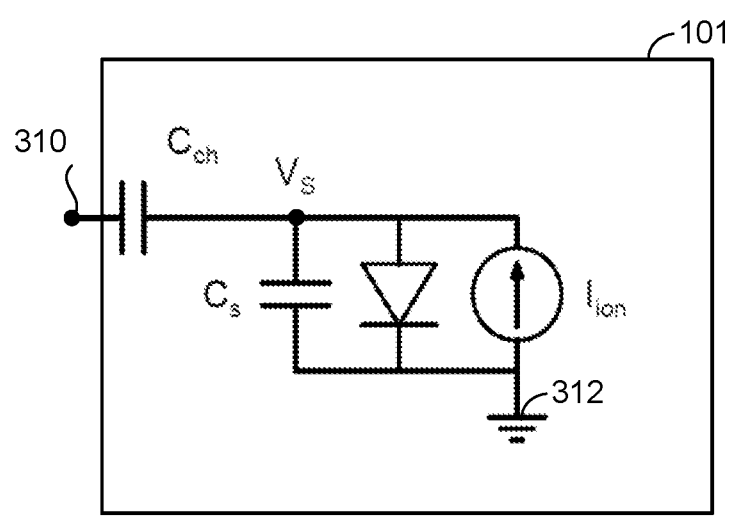
FIG. 3 is a schematic diagram electrically representing aspects of a plasma processing chamber.

Referring briefly to FIG. 3, shown is a schematic drawing that electrically depicts aspects of an exemplary plasma load within the plasma processing chamber 101. As shown, the plasma processing chamber 101 may be represented by a chuck capacitance $C_{ch}$ (that includes a capacitance of a chuck and workpiece 103) that is positioned between an input 310 (also referred to as an input node 310) to the plasma processing chamber 101 and a node representing a sheath voltage, Vs, at a surface of the workpiece 103 (also referred to as substrate 103). In addition, a return node 312 (which may be a connection to ground) is depicted. The plasma 102 in the processing chamber is represented by a parallel combination of a sheath capacitance $C_s$, a diode, and a current source. The diode represents the non-linear, diode-like nature of the plasma sheath that results in rectification of the applied AC field, such that a direct-current (DC) voltage drop, appears between the workpiece 103 and the plasma 102.

Referring to FIGS. 4A, 4B, 4C, 4D, 4E, 4F, and 4G, shown are bias supplies 408A, 408B, 408C, 408D, 408E, 408F, 408G, respectively, that may be utilized to realize the bias supply 208, and hence, bias supplies 408A to 408G may be utilized as the bias supplies 108 depicted in FIG. 1. As shown, each of the bias supplies 408A to 408G comprises a resonant switch section 220 in connection with variations of the power section 230 that comprise one or more voltage sources and inductors arranged in a variety of topologies. More specifically, in each of FIGS. 4A, 4B, 4C, 4D, 4E, 4F, and 4G, the depicted voltage sources, inductors, and interconnections between the voltage sources and inductors make up variations of the power section 230.

As shown, each of the bias supplies is configured to apply a periodic voltage comprising: an output node 210 and a return node 212, and each of the bias supplies comprises a resonant switch section 220 that is coupled to a power section at a first node 214, a second node 216, and a third node 218. The power section of each of the bias supplies 408A, 408B, 408C, 408D, 408E, 408F, 408G varies from other ones of the bias supplies, but each of the bias supplies 408A, 408B, 408C, 408D, 408E, 408F, 408G comprises a first voltage source 222 coupled between the third node 218 and the first node 214 and a second voltage source 224 coupled to the return node 212. As discussed further herein switching action of the resonant switch section 220 results in an application of the periodic voltage between the output node 210 and the return node 212.

Figure 4A:
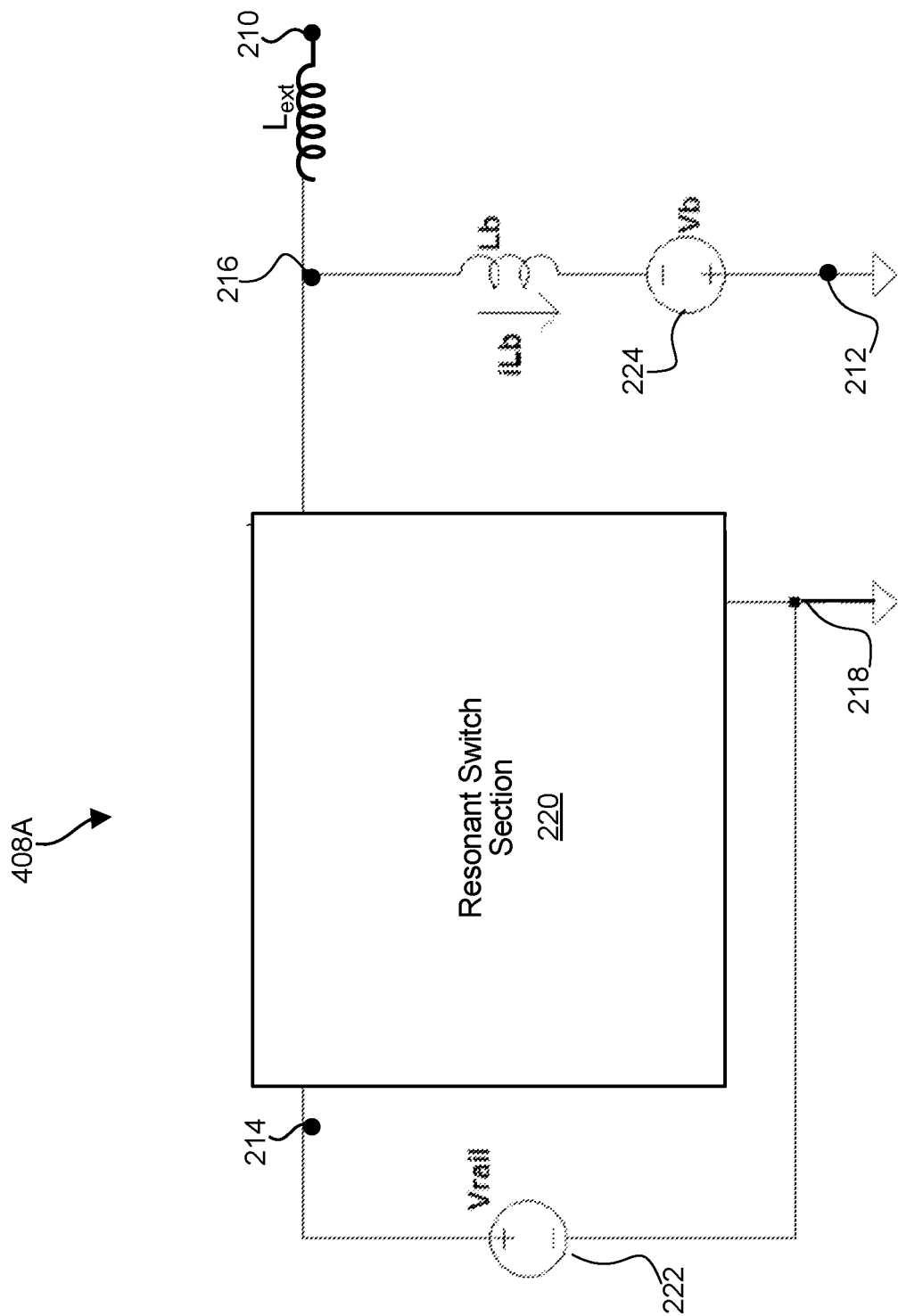
FIGS. 4A, 4B, 4C, 4D, 4E, 4F, and 4G each depict an example of the bias supply depicted in FIG. 2.

In the variation depicted in FIG. 4A, a first inductor. Lb, is positioned between the second node 216 and a negative terminal of the second voltage source 224. In addition, an inductance, Lext, is positioned between the second node 216 and the output node 210. The inductance, Lext, may be a stray inductance or an intentionally added inductor.

In the variations depicted in FIGS. 4B, 4C, 4D, and 4F, the first inductor, Lb, is positioned between the output node 210 and the second voltage source 224. It is also noted that, in the variations depicted in FIGS. 4B, 4C, 4D, and 4F, the second node 216 and the output node 210 are a common node so that the first inductor, Lb, is positioned between the second node 216 and the second voltage source 224. As shown in FIGS. 4B, 4C, 4D, and 4F, the first inductor, Lb, is coupled between the output node 210 and a negative terminal of the second voltage source 224.

Figure 4B:
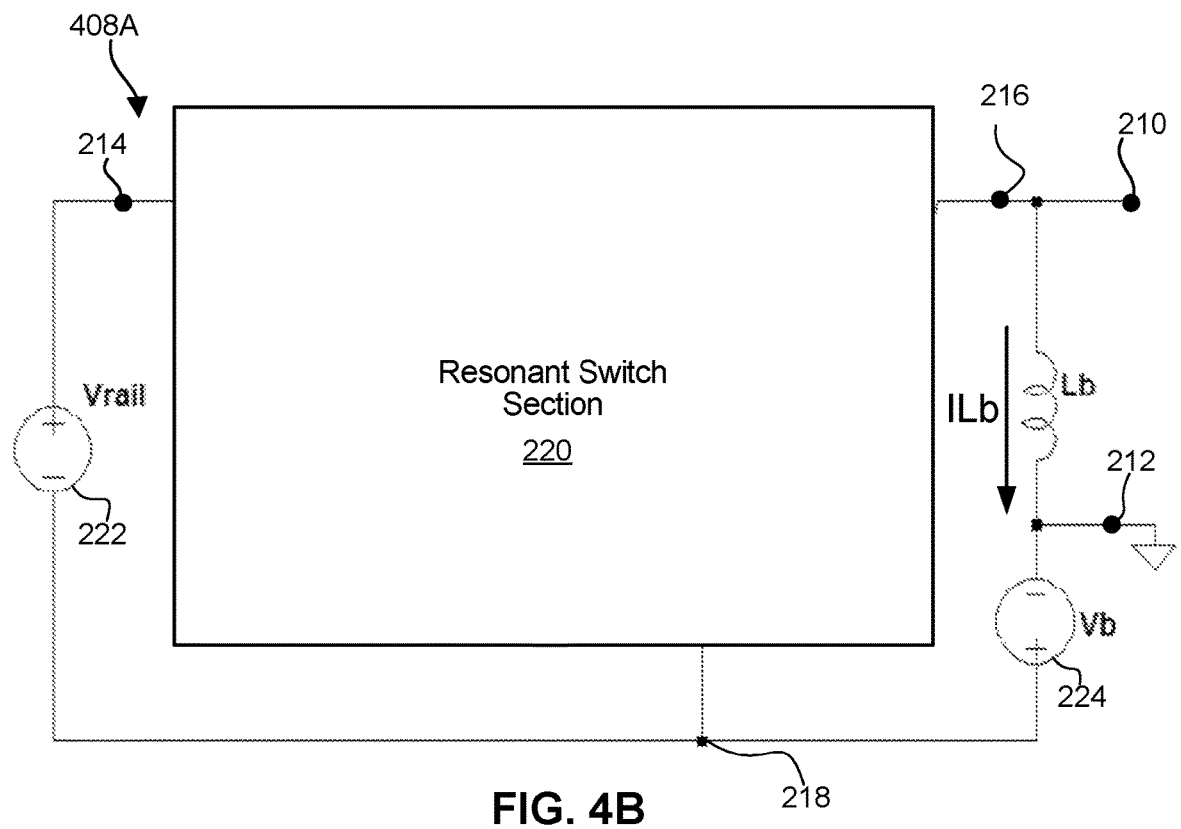
Figure 4C:
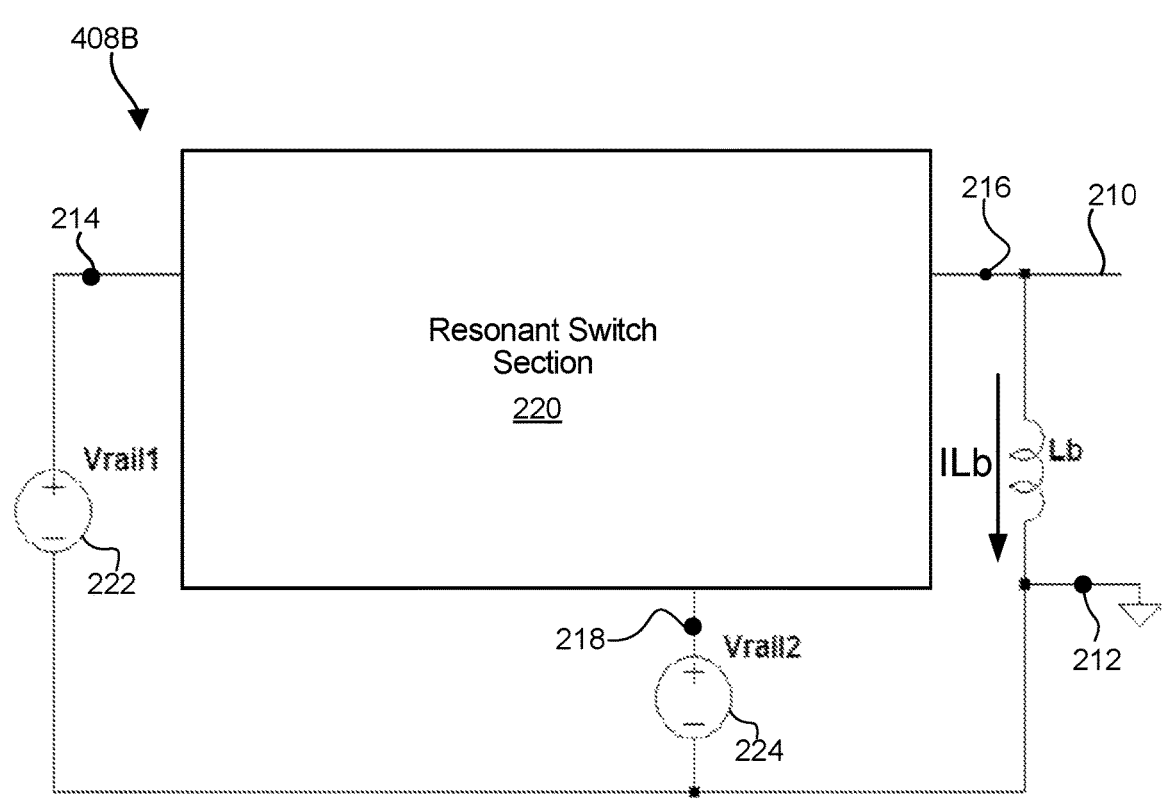
Figure 4D:
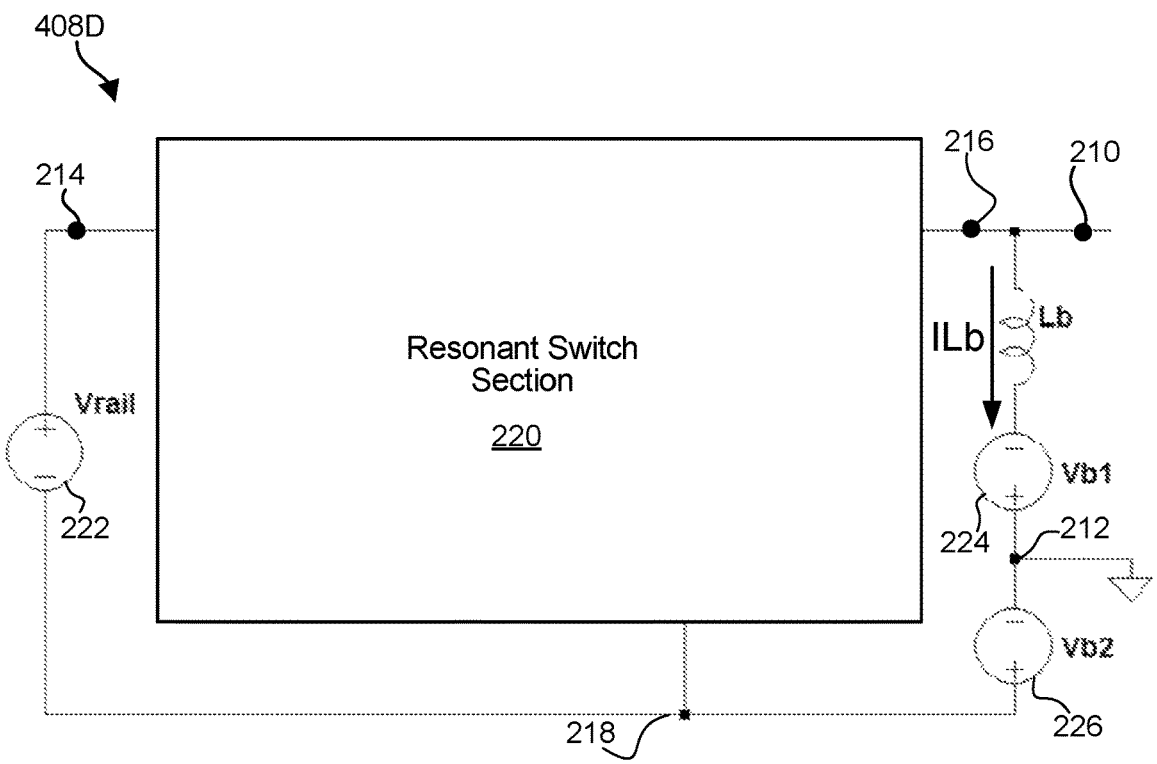
Figure 4E:
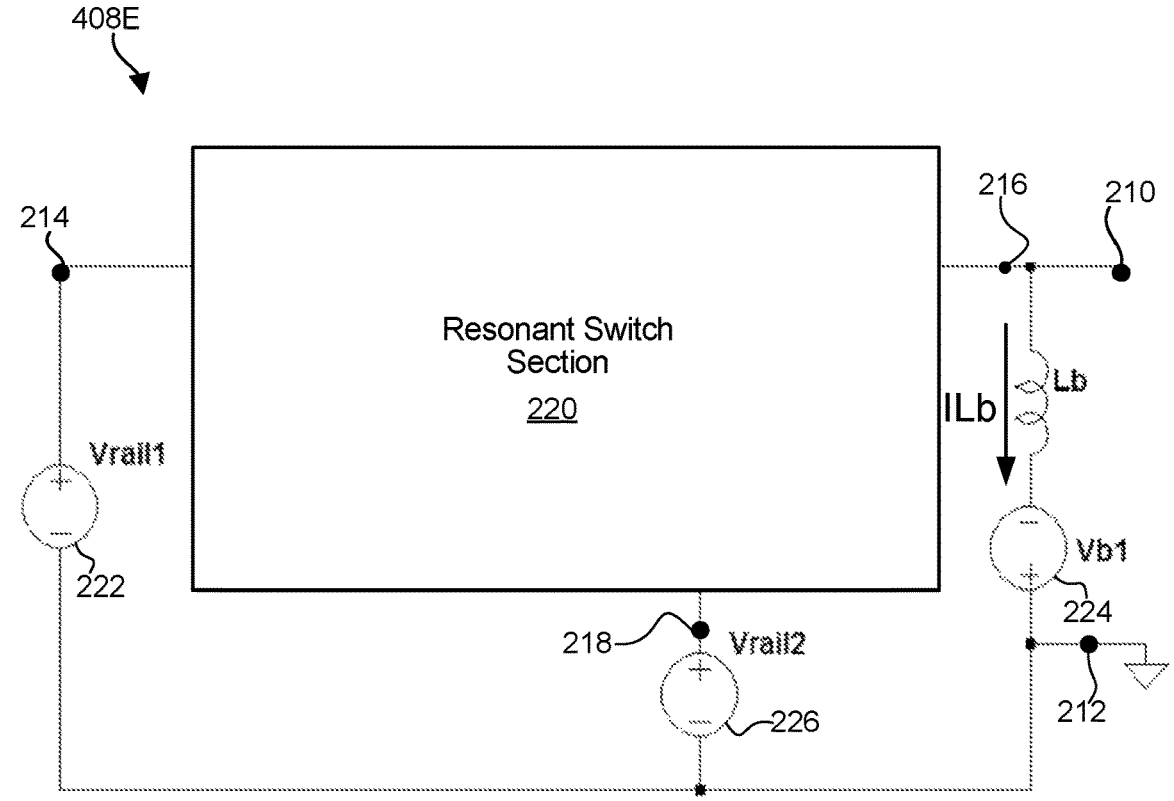

In the variations of FIGS. 4B and 4C, the return node 212 is a connection point between the first inductor, Lb, and the second voltage source. 224 In the variations depicted in FIGS. 4A, 4D, and 4E, the positive node of the second voltage source 224 is coupled to the return node 212, and in the variations depicted in FIGS. 4B and 4C, a negative terminal of the second voltage source 224 is coupled to the return node.

The bias supplies 408D, 408E depicted in FIGS. 4D and 4E depict variations that comprise a third voltage source 226 where a negative terminal of the third voltage source 226 is connected to the return node 212. In the variation of FIG. 4D, a positive terminal of the third voltage source 226 is connected to the third node 218 and the negative terminal of the first voltage source 226, and in the variation of FIG. 4E, a positive terminal of the of the third voltage source 226 is connected to the third node 218 and the negative terminal of the third voltage source 226 is coupled to the negative terminal of the first voltage source 222.

In the example bias supply 408D, the third voltage source 226 adds a DC compensation voltage, which may be used to adjust a chucking force applied by an electrostatic chuck within the plasma processing chamber 101. In some modes of operation, the total voltage applied by second voltage source 224 and the third voltage source 226 is set to a constant value so that the voltage applied by the second voltage source 224 is decreased when the voltage applied by the third voltage source 226 is increased.

Figure 4F:
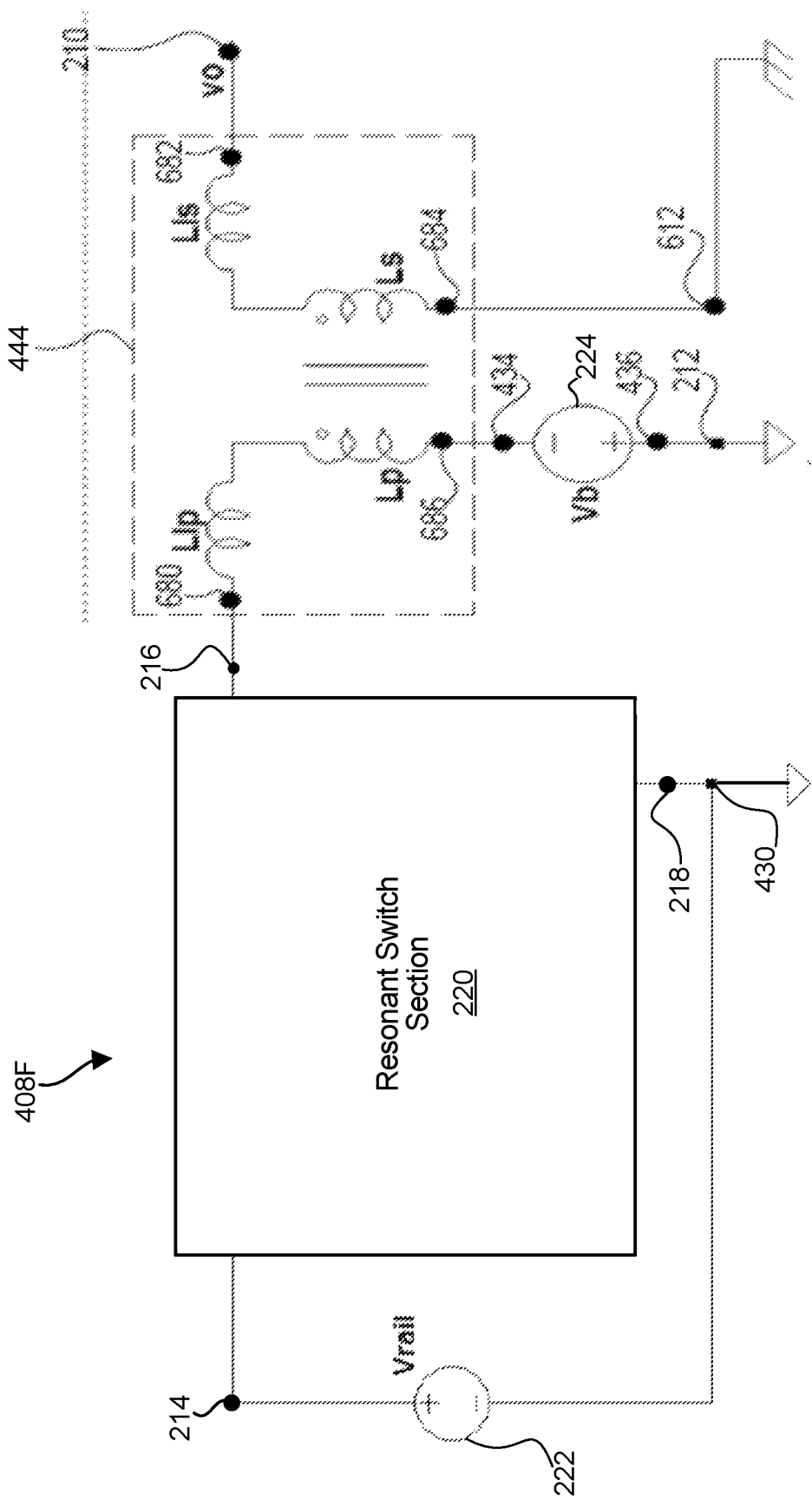

Referring next to FIG. 4F, shown is another example bias supply 408F that may be used to implement the bias supply 208. As shown, a transformer 444 is used to apply power to the output node 210 of the bias supply. The transformer 444 includes a primary winding (represented by Llp and Lp) and a secondary winding (represented by Lls and Ls). A first node 680 of the primary winding of the transformer 444 is coupled to the second node 216. A first node 682 of the secondary winding of the transformer 444 is coupled to the output node 210. And a second node 684 of the secondary winding of the transformer 444 is coupled to a secondary-side return node 612 on the secondary side of the transformer 444. The first voltage source 222 is coupled between the first node 214 and the third node 218 of the resonant switch section 220. The second voltage source 224 is coupled between a second node 686 of the primary winding of the transformer 444 and the return node 212.

Figure 4G:
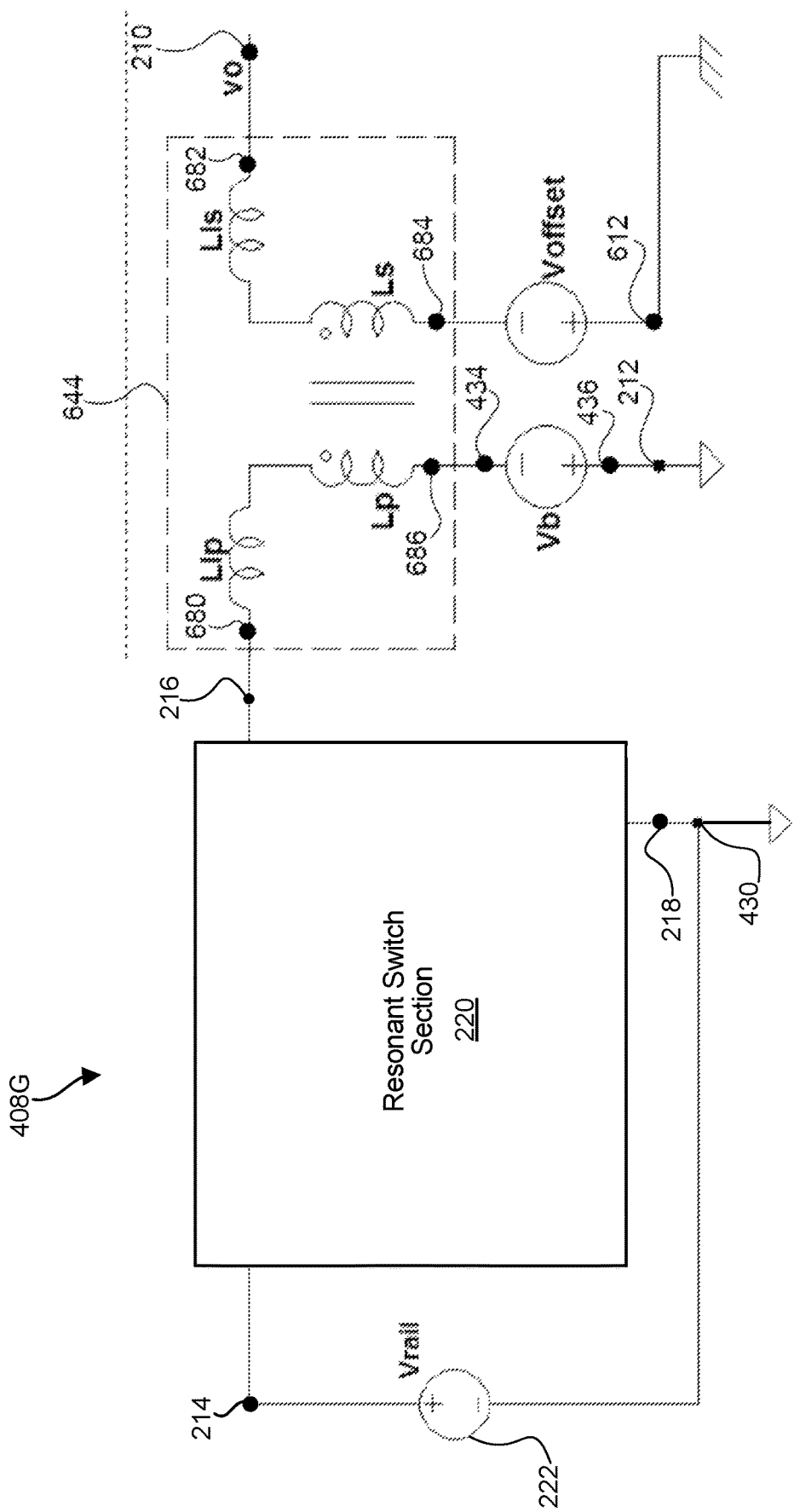

The bias supply 408G shown in FIG. 4G is the same as the bias supply shown in FIG. 4G except that an offset-voltage-source, Voffset, is coupled between the second node 684 of the secondary winding of the transformer 444 and the secondary-side return node 612. More specifically, a positive terminal of the offset-voltage-source, Voffset, is coupled to the secondary-side return node 612 and a negative terminal offset-voltage-source, Voffset, is coupled to the second node 684 of the transformer 444.

Figure 5A:
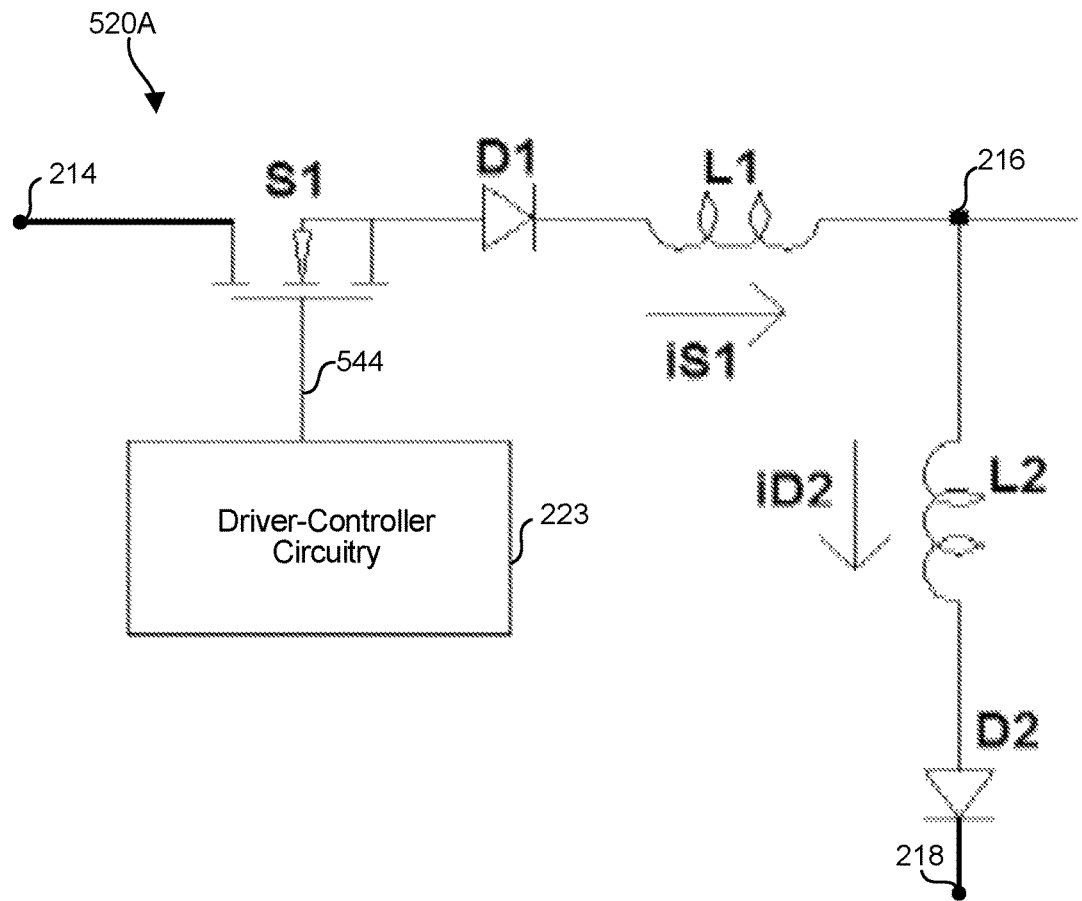
FIGS. 5A, 5B, and 5C are schematic diagrams, and each of FIGS. 5A, 5B, and 5C depict an example of the resonant switch section.
Figure 5B:
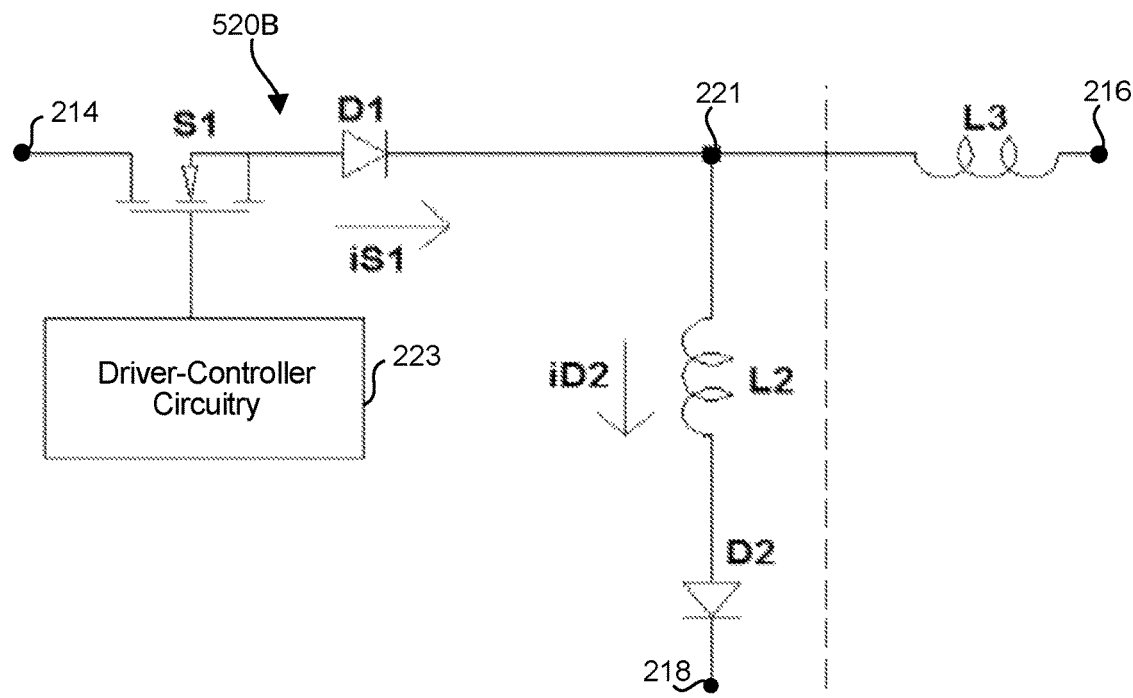
Figure 5C:
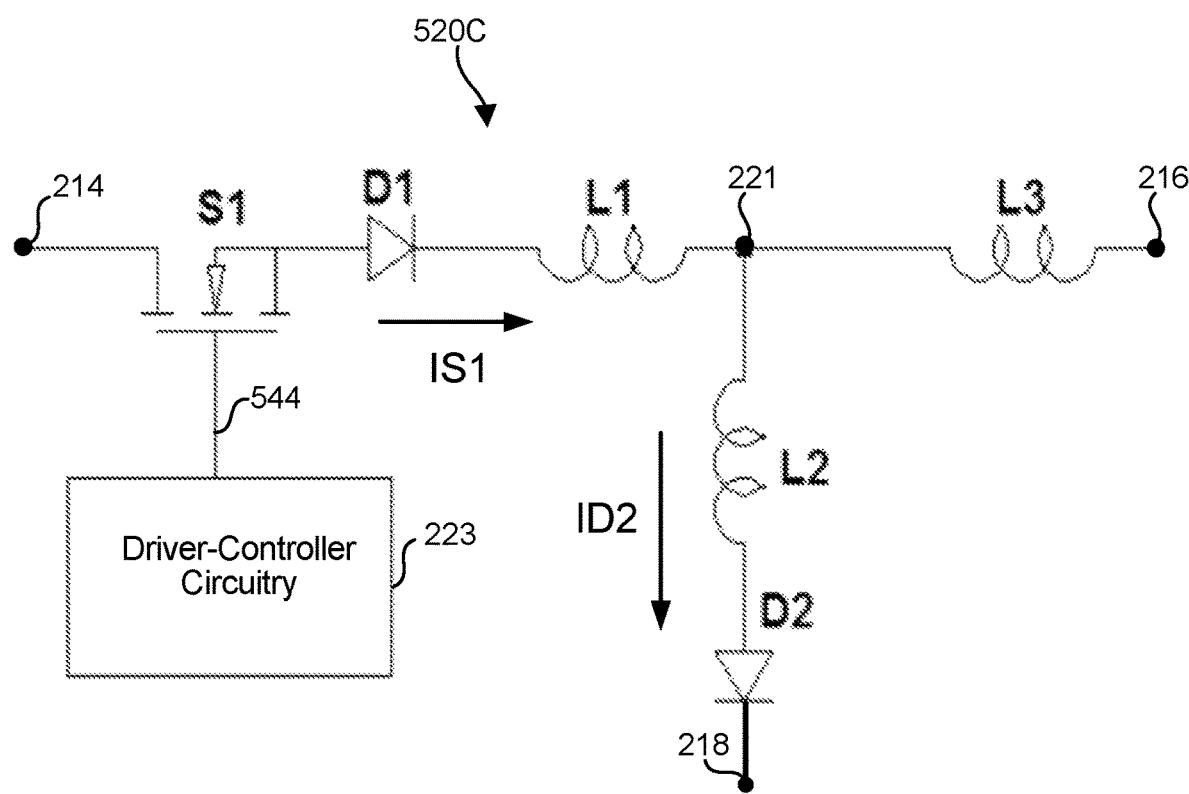

Referring next to FIGS. 5A, 5B, and 5C, shown are variations of the resonant switch section 220. As shown, the resonant switch section 520A, 520B, 520C comprises the first node 214, the second node 216, and the third node 218, and each of the variations comprises a first current pathway (for current iS1), between the first node 214 and the second node 216. The first current pathway comprises a series combination of a switch, S1, and a diode, D1. In addition, each of the variations of the resonant switch section 520A, 520B, 520C comprises second current pathway (for current iD2), (between the first current pathway and the third node 218), which comprises a second diode, D2, and an inductive element, L2. As shown, the resonant switch section 520A, 520B, 520C also comprises driver-controller circuitry 223 that is coupled to the switch, S1, via a drive signal line 544.

It should be recognized that each of the diode, D1, and the diode, D2, may be realized by a plurality of diodes. For example, either diode, D1, and/or diode, D2, may be realized by a plurality of series-connected diodes (to enhance voltage capability). Or either diode, D1, and/or diode, D2, may be realized by a plurality of diodes arranged in parallel (to enhance current capability).

In the resonant switch section 520A the first current pathway comprises a series combination of the switch, S1, an inductive element, L1, and the diode, D1, arranged between the first node 214 and the second node 216. It should be recognized that (because the switch, S1, the diode, D1, and the inductor, L1 are arranged in series), the order in which the switch, S1, the diode D1, and the inductor, L1 are positioned (between the first node 214 and the second node 216) may vary.

In the resonant switch section 520B the first current pathway comprises the switch, S1, arranged in series with the diode, D1, and the series combination of the switch, S1, and the diode, D1, is coupled between the first node 214 and a fourth node 221. In addition, the second current path (for iD2) comprises a series combination of the inductor, L2, and the diode, D2, between the fourth node 221 and the third node 218. In addition, the resonant switch section 520B comprises an inductor, L3, between the fourth node 221 and the second node 216.

Referring to FIG. 5C, the resonant switch section 520C is similar to the resonant switch section 520B except the first current pathway comprises a series combination of the switch, S1, inductive element, L1, and the diode, D1, arranged between the first node 214 and the fourth node 221. It should be recognized that (because the switch, S1, the diode, D1, and the inductor, L1 are arranged in series), the order in which the switch, S1, the diode D1, and the inductor, L1 are positioned (between the first node 214 and the fourth node 216) may vary.

In many implementations, the switch, S1 is realized by a field-effect switch such as metal-oxide semiconductor field-effect transistors (MOSFETS), and in some implementations, the switch, S1, is realized by silicon carbide metal-oxide semiconductor field-effect transistors (SiC MOSFETs) or gallium nitride metal-oxide semiconductor field-effect transistors (GaN MOSFETs). As another example, the switch, S1, may be realized by an insulated gate bipolar transistor (IGBT). In these implementations, the driver-controller circuitry 223 may comprise an electrical driver known in the art that is configured to apply power signals to the switch, S1, via drive signal line 544 responsive to signals from a controller. It is also contemplated that the controller may be capable of applying a sufficient level of power so that a separate electrical driver may be omitted. It is also contemplated that the drive signal line 544 may be an optical line to convey optical switching signals. And the switch, S1, may switch in response to the optical signal and/or optical signals that are converted to an electrical drive signal.

It should be recognized that the switch, S1, generally represents one or more switches that are capable of closing and opening to connect and disconnect, respectively, the first current pathway between the first node 214 and the second node 216. For example, the switch, S1, may be realized by a plurality of switches arranged is series (for enhanced voltage capability). Or the switch, S1, may be realized by a plurality of switches arranged is parallel (for enhanced current capability). In these variations, one of ordinary skill in the art will recognize that each switch may be synchronously driven by a corresponding drive signal.

Referring next to FIGS. 6A and 6B, shown are graphs depicting operational aspects of the variations of the bias supply 208 disclosed herein to achieve an asymmetric periodic voltage between the output node 210 and the return node 212 of the bias supply 208 during a full cycle of an asymmetric periodic voltage, Vo, from the time t0 to the time t3. More specifically, FIG. 6A depicts operational aspects of the bias supply 208 when a voltage (Vrail) of the first voltage source 222 is less than or equal to zero. And FIG. 6B depicts operational aspects of the bias supply 208 when the voltage (Vrail) of the first voltage source 222 is greater than zero. Also depicted in FIGS. 6A and 6B is a sheath voltage, Vs, that corresponds to the asymmetrical periodic voltage. As shown, the asymmetric periodic voltage achieves a sheath voltage, Vs, that is generally negative to attract ions to impact a surface of the workpiece to enable etching of the workpiece 103.

As shown in FIG. 6A, when the switch, S1, is closed at a time t0, the current pathway (comprising the switch, S1, and diode, D1) connects the first node 214 to the second node 216 and unidirectional current, iS1, begins to increase from zero current at the time, t0, and the asymmetrical periodic voltage, V0, (relative to the return node 212) applied at the output node 210 begins to move (over a first portion 651 of the of the periodic voltage waveform) from a first negative voltage 652 to a positive peak voltage 656. As shown, the current, iS1, increases to a peak value 654 and then decreases to zero at a time, t1, when the switch, S1, is opened.

As depicted, when the switch, S1, is opened, the current, iS1, through the first current pathway drops to zero and the asymmetric periodic voltage drops from the positive peak voltage 656. As shown, when the switch, S1, is opened, (during a second portion 653 of the asymmetrical waveform) unidirectional current, iD2, begins to flow through the second current pathway through the second diode, D2, peaks, and then drops to zero current flow, from time t1 to a time t2. As shown, the rise and fall of the unidirectional current, iD2, occurs while the asymmetrical periodic voltage changes (during the second portion 653) from the positive peak voltage 656 to a third. negative, voltage level 658. As depicted, during the time from t0 to t2, the first portion 651 of the asymmetric periodic voltage causes the sheath voltage to approach a positive voltage to repel positive charges (that accumulate on the surface of the workpiece while the surface of the workpiece is held at a negative voltage), and the second portion 653 of the asymmetric periodic voltage causes the sheath voltage to become a desired negative voltage (or range of voltages) to achieve an ion flux that achieves a desired ion energy 670.

As depicted, after the unidirectional current, iD2, rises and falls back to a level of zero current, the asymmetrical periodic voltage, V0, becomes more negative (as a negative voltage ramp) during a fourth portion 661 until the switch, S1, is closed again at a time t3. As depicted, a compensation iLb, produced by the second voltage source 224, may be provided during a cycle of the asymmetric periodic voltage to compensate for ion current in the plasma chamber 101. For example, without the compensation current, iLb, that sheath voltage, Vs, may gradually change to become more positive during the fourth portion of the asymmetric periodic voltage, which creates a broader distribution of ion energies, which may be undesirable. But in some variations, the compensation current, iLb, may intentionally be set to overcompensate or undercompensate for ion current in the plasma chamber 101 to create a broader distribution of ion energies. In the modes of operation depicted in FIGS. 6A and 6B, the compensation current, iLb, provides a sheath voltage, Vs, that is substantially constant during the fourth portion 661 of the asymmetrical periodic voltage, Vo.

As shown in FIG. 6B, when the voltage, Vrail, from the first voltage source 222 is greater than zero, the operational aspects of the bias supply 208 are similar to the operational aspects of the bias supply 208 when the voltage, Vrail, from the first voltage source 222 is less than zero except the current, iD2, increases in a ramp-like manner while the switch, S1, is closed so that the current iD2 is non-zero when the switch, S1 is opened at the time, t1.

Figure 7:
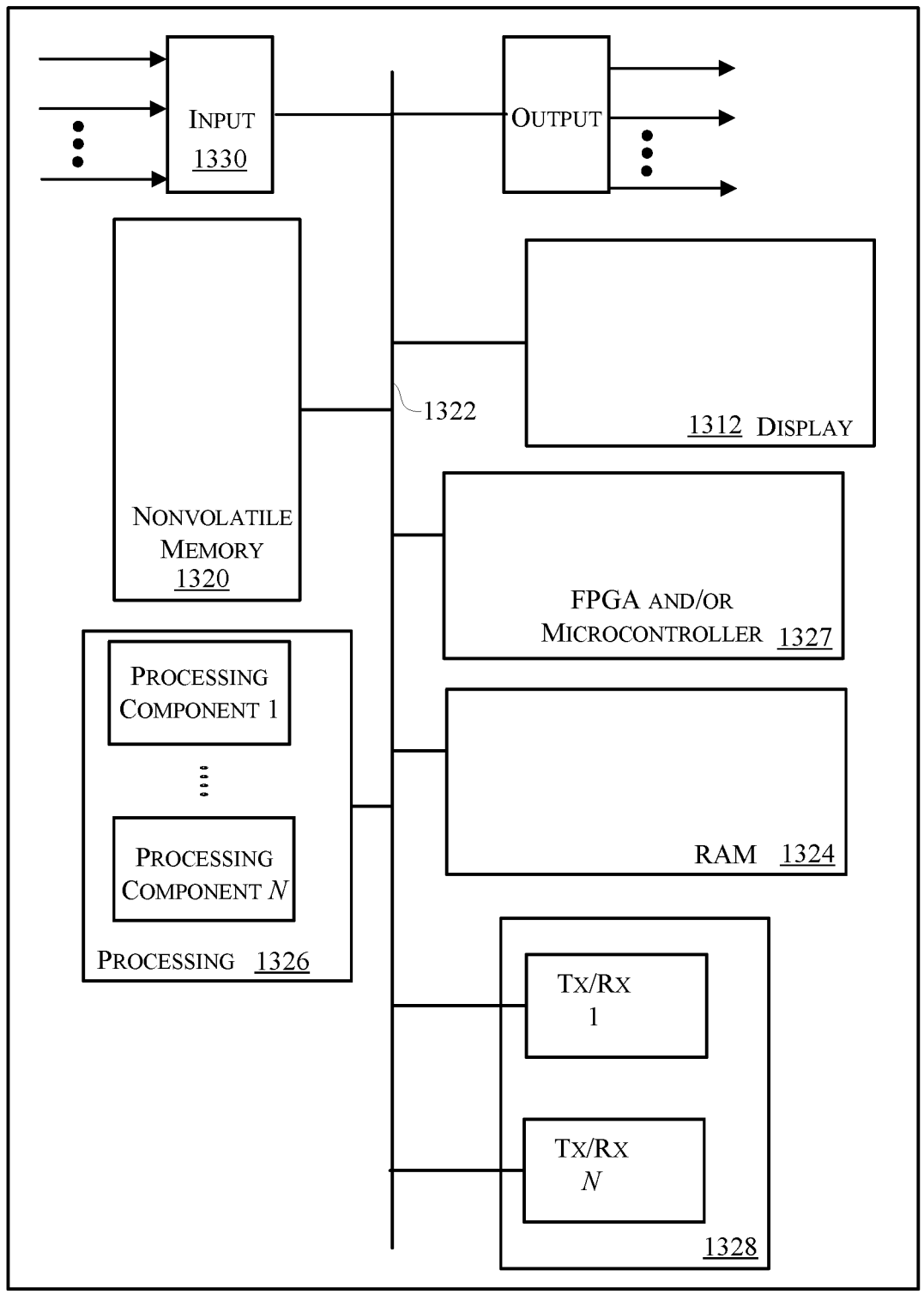
FIG. 7 is a block diagram depicting components that may be utilized to implement control aspects disclosed herein.

The methods described in connection with the embodiments disclosed herein may be embodied directly in hardware, in processor-executable code encoded in a non-transitory tangible processor readable storage medium, or in a combination of the two. Referring to FIG. 7 for example, shown is a block diagram depicting physical components that may be utilized to realize control aspects disclosed herein. As shown, in this embodiment a display 1312 and nonvolatile memory 1320 are coupled to a bus 1322 that is also coupled to random access memory ("RAM") 1324, a processing portion (which includes N processing components) 1326, a field programmable gate array (FPGA) 1327, and a transceiver component 1328 that includes N transceivers. Although the components depicted in FIG. 7 represent physical components, FIG. 7 is not intended to be a detailed hardware diagram; thus, many of the components depicted in FIG. 7 may be realized by common constructs or distributed among additional physical components. Moreover, it is contemplated that other existing and yet-to-be developed physical components and architectures may be utilized to implement the functional components described with reference to FIG. 7.

This display 1312 generally operates to provide a user interface for a user, and in several implementations, the display is realized by a touchscreen display. In general, the nonvolatile memory 1320 is non-transitory memory that functions to store (e.g., persistently store) data and processor-executable code (including executable code that is associated with effectuating the methods described herein). In some embodiments for example, the nonvolatile memory 1320 includes bootloader code, operating system code, file system code, and non-transitory processor-executable code to facilitate the execution of a method of biasing a substrate with the single controlled switch.

In many implementations, the nonvolatile memory 1320 is realized by flash memory (e.g., NAND or ONENAND memory), but it is contemplated that other memory types may be utilized as well. Although it may be possible to execute the code from the nonvolatile memory 1320, the executable code in the nonvolatile memory is typically loaded into RAM 1324 and executed by one or more of the N processing components in the processing portion 1326.

The N processing components in connection with RAM 1324 generally operate to execute the instructions stored in nonvolatile memory 1320 to enable execution of the algorithms and functions disclosed herein. It should be recognized that several algorithms are disclosed herein, but some of these algorithms are not represented in flowcharts. Processor-executable code to effectuate methods described herein may be persistently stored in nonvolatile memory 1320 and executed by the N processing components in connection with RAM 1324. As one of ordinarily skill in the art will appreciate, the processing portion 1326 may include a video processor, digital signal processor (DSP), microcontroller, graphics processing unit (GPU), or other hardware processing components or combinations of hardware and software processing components (e.g., an FPGA or an FPGA including digital logic processing portions).

In addition, or in the alternative, non-transitory FPGA-configuration-instructions may be persistently stored in nonvolatile memory 1320 and accessed (e.g., during boot up) to configure a field programmable gate array (FPGA) to implement the algorithms disclosed herein.

The input component 1330 may receive signals (e.g., signals indicative of current and voltage obtained at the output of the disclosed bias supplies). In addition, the input component 1330 may receive phase information and/or a synchronization signal between bias supplies 108 and source generator 112 that are indicative of one or more aspects of an environment within a plasma processing chamber 101 and/or synchronized control between a source generator and the single switch bias supply. The signals received at the input component may include, for example, synchronization signals, power control signals to the various generators and power supply units, or control signals from a user interface. Those of ordinary skill in the art will readily appreciate that any of a variety of types of sensors such as, without limitation, directional couplers and voltage-current (VI) sensors, may be used to sample power parameters, such as voltage and current, and that the signals indicative of the power parameters may be generated in the analog domain and converted to the digital domain.

The output component generally operates to provide one or more analog or digital signals to effectuate the opening and closing of the switch, S1. The output component may also control of the voltage sources described herein.

The depicted transceiver component 1328 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A bias supply to apply a periodic voltage comprising:
    an output node;
    a return node;
    a resonant switch section comprising:
        a first node, a second node, and a third node;
        a first current pathway between the first node and the second node, the first current pathway comprising a series combination of a switch and a diode;
        a second current pathway between the second node and the third node comprising a diode and an inductive element; and
    a power section comprising:
        a first voltage source coupled between the third node and the first node; and
        a second voltage source coupled to the return node;
        wherein closing the switch causes unidirectional current in the first and second current pathways to cause an application of the periodic voltage between the output node and the return node.

2. The bias supply of claim 1,
    wherein the first current pathway is configured so the unidirectional current in the first pathway increases from zero current at a time $t_0$ when the switch is closed to a peak value and then decreases back to zero at a time $t_1$ when the switch is opened and a voltage between the output node and return node increases from a negative voltage at the time $t_0$ to a peak value at the time $t_1$.

3. The bias supply of claim 1, wherein the first current pathway comprises a series combination of the switch, inductive element, and the diode coupled between the first node and the second node.

4. The bias supply of claim 1, wherein the first current pathway comprises two inductive elements that are coupled together at the second node.

5. The bias supply of claim 1, wherein the power section comprises a series combination of the second voltage source and an inductive element coupled between the output node and the return node.

6. The bias supply of claim 1, wherein the second voltage source is coupled between the second node and the return node.

7. The bias supply of claim 1, wherein a negative terminal of the second voltage source is coupled to a negative terminal of the first voltage source.

8. The bias supply of claim 1, comprising a third voltage source coupled between the third node and the return node.

9. A bias supply to apply a periodic voltage comprising:
    an output node;
    a return node;

a power section coupled to the output node and the return node;

a resonant switch section coupled to the power section at a first node, a second node, and a third node wherein the resonant switch section is configured to connect and disconnect a current pathway between the first node and the second node to cause an application of an asymmetric periodic voltage waveform at the output node relative to the return node, wherein each cycle of the asymmetric periodic voltage waveform includes a first portion that begins with a first negative voltage and changes to a positive peak voltage, a second portion that changes from the positive peak voltage level to a third voltage level and a fourth portion that includes a negative voltage ramp from the third voltage level to a fourth voltage level; and an offset voltage source, wherein a second node of a secondary winding of the transformer is coupled to the return node via the offset voltage source;

wherein the power section comprises:

a transformer, a first node of a primary winding of the transformer coupled to a second node of the resonant switch section, a first node of the secondary winding of the transformer coupled to the output node, and a second node of the secondary winding of the transformer coupled to the return node; and a voltage source coupled between a second node of the primary winding of the transformer and the return node.

10. The bias supply of claim 9 wherein connecting the current pathway causes the first portion of the asymmetric periodic voltage waveform that begins with a first negative voltage and changes to the positive peak voltage.

11. The bias supply of claim 10, wherein disconnecting the current pathway causes the second portion of the asymmetric periodic voltage waveform that changes from the positive peak voltage level to the third voltage level.

12. The bias supply of claim 11, wherein the power section comprises a voltage source in series with an inductive element coupled between the second node and the return node.

* * * * *